(12) United States Patent
Fukuda et al.

(10) Patent No.: US 6,717,785 B2
(45) Date of Patent: Apr. 6, 2004

(54) SEMICONDUCTOR SWITCHING ELEMENT DRIVING CIRCUIT

(75) Inventors: Yutaka Fukuda, Kariya (JP); Ryoichi Okuda, Toyoake (JP); Tomoatsu Makino, Okazaki (JP); Kenji Yagi, Okazaki (JP); Yukio Tsuzuki, Nukata-gun (JP)

(73) Assignee: Denso Corporation, Kariya (JP)

( * ) Notice: Subject to any disclaimer, the term of this patent is extended or adjusted under 35 U.S.C. 154(b) by 433 days.

(21) Appl. No.: 09/819,715

(22) Filed: Mar. 29, 2001

(65) Prior Publication Data
US 2001/0026429 A1 Oct. 4, 2001

(30) Foreign Application Priority Data

| | | |
|---|---|---|
| Mar. 31, 2000 | (JP) | 2000-101305 |
| Aug. 1, 2000 | (JP) | 2000-232985 |
| Feb. 2, 2001 | (JP) | 2001-027323 |

(51) Int. Cl.⁷ .............................. H02H 3/08; H02H 9/02
(52) U.S. Cl. ........................................ 361/93.1; 361/86
(58) Field of Search .................... 361/93.1, 87, 93, 361/86, 101; 257/262, 265

(56) References Cited

U.S. PATENT DOCUMENTS

| | | | | |
|---|---|---|---|---|
| 5,200,879 A | * | 4/1993 | Sasagawa et al. | 361/93 |
| 5,375,028 A | | 12/1994 | Fukunaga | |
| 5,375,029 A | * | 12/1994 | Fukunaga et al. | 361/101 |
| 5,396,117 A | | 3/1995 | Housen et al. | |
| 5,444,595 A | * | 8/1995 | Ishikawa et al. | 361/86 |
| 5,485,341 A | * | 1/1996 | Okado et al. | 361/98 |
| 5,540,444 A | * | 7/1996 | Nguyen | 318/139 |
| 5,550,702 A | * | 8/1996 | Schmidt et al. | 361/103 |
| 5,710,508 A | * | 1/1998 | Watanabe | 323/284 |
| 5,729,032 A | * | 3/1998 | Tomomatsu et al. | 257/139 |
| 5,753,942 A | * | 5/1998 | Seok | 257/133 |
| 5,883,483 A | | 3/1999 | Nagata et al. | |
| 5,910,736 A | | 6/1999 | Nagata et al. | |
| 5,918,982 A | | 7/1999 | Nagata et al. | |
| 5,977,756 A | | 11/1999 | Nagata et al. | |
| 5,999,041 A | | 12/1999 | Nagata et al. | |

FOREIGN PATENT DOCUMENTS

| | | |
|---|---|---|
| EP | 0487964 A2 | 11/1991 |
| JP | A-63-95728 | 4/1988 |
| JP | A-2-130951 | 5/1990 |
| JP | A-7-297697 | 11/1995 |
| JP | A-8-139578 | 5/1996 |
| JP | A-9-64707 | 3/1997 |
| JP | B-2643459 | 5/1997 |
| JP | A-10-145206 | 5/1998 |

* cited by examiner

Primary Examiner—Brian Sircus
Assistant Examiner—Z Kitov
(74) Attorney, Agent, or Firm—Posz & Bethards, PLC

(57) ABSTRACT

A semiconductor switching element driving circuit comprises an overcurrent limiting circuit which instantaneously drops a voltage of a gate terminal of an IGBT when a main IGBT current becomes larger than a predetermined level i1. An overcurrent protection circuit which first decreases the main IGBT current at a first inclination when the main IGBT current becomes larger than the other level i2 lower than the i1 and then reduces the main IGBT current at a steep second inclination when it becomes smaller than another level i3.

21 Claims, 12 Drawing Sheets

FIG. 2A  Ic

FIG. 2B  OUTPUT OF LATCH CIRCUIT

FIG. 2C  Vg

FIG. 2D  Vce

FIG. 8
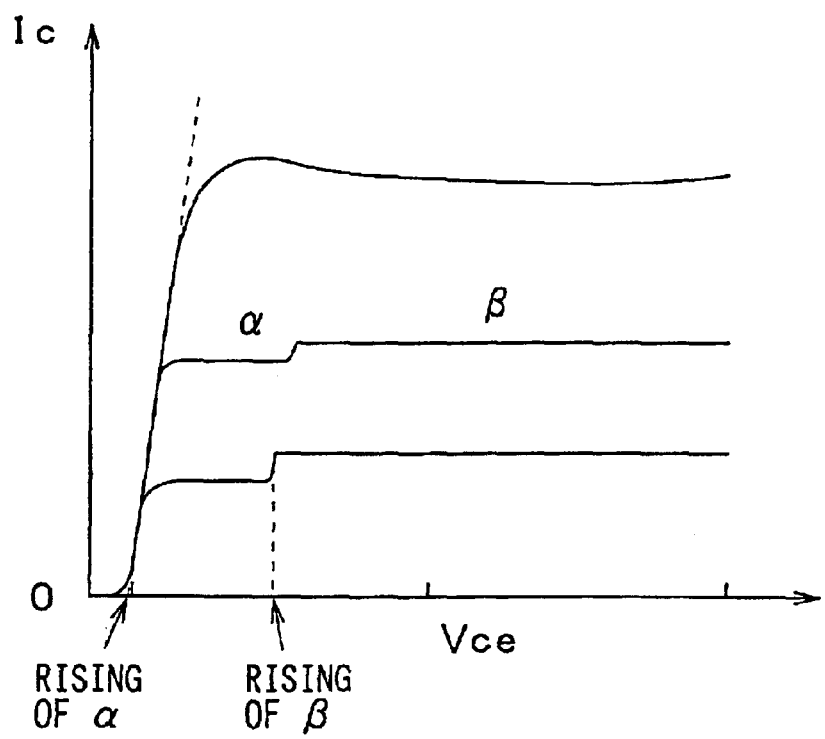
FIG. 9A
FIG. 9B
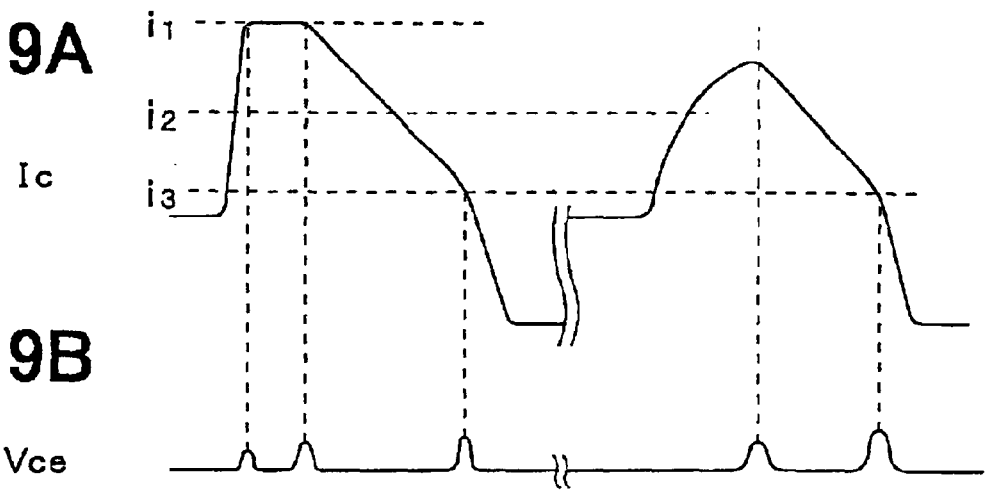

SEMICONDUCTOR SWITCHING ELEMENT DRIVING CIRCUIT

CROSS REFERENCE TO RELATED APPLICATIONS

This application is based on Japanese Patent Application Nos. 2000-101305 filed on Mar. 31, 2000, 2000-232985 filed on Aug. 1, 2000, and 2001-27323, filed on Feb. 2, 2001, the contents of which are incorporated herein by reference.

1. Field of the Invention

The present invention relates to a semiconductor switching element driving circuit having an overcurrent protection function, in particular, which is preferably applied to a circuit for driving an IGBT or the like that is used in a motor driving circuit of an electric vehicle or the like.

2. Related Arts

In the case of using a semiconductor switching element, e.g. the IGBT for driving a motor, when a load short circuit or the like occurs, a collector current of the IGBT rapidly increases and the IGBT is broken by an overcurrent or heat. Therefore, in order to prevent the IGBT from being destroyed, there is a need to detect the overcurrent to cut off the IGBT by a protection circuit within a short time.

However, since there is a case where noises equivalent to the overcurrent occur, malfunctions due to such noises must be prevented. On this account, cutting off the IGBT at high speed while retaining a malfunction withstand capacity is difficult.

Additionally, when a gate voltage is cut off, a voltage is varied from a normal driving voltage to 0V at high speed and thus a rate of a current change −dI/dt at the high-speed cutoff becomes great, a jumping voltage caused by a wiring inductance is increased and the IGBT may be broken by an excess current caused by breakdown due to the jumping voltage larger than a withstand voltage.

A semiconductor switching element driving circuit that solves the above problems is described in the Japanese Patent Laid-Open Application No. 64707/1997. The semiconductor switching element driving circuit described in this publication is shown in FIG. 11.

This conventional semiconductor switching element driving circuit has a configuration in which a short circuit protection transistor 104 is disposed between a gate terminal 101a and a sense terminal (current detecting emitter terminal) 101b of the IGBT 101 for being turned on faster than a short circuit delay time T1 determined by a comparator 102 and a driver circuit 103, and a condenser 105 is disposed between the sense terminal 101b of the IGBT 101 and an earth for prevention of the malfunctions due to the noises.

By such a configuration, as the condenser 105 prevents the malfunctions due to the noises, when the overcurrent occurs due to the load short circuit, the short circuit protection transistor 104 is turned on faster than the delay time T1 to decrease a gate voltage Vge of the IGBT 101 and after the delay time T1 has passed, the IGBT 101 is to be cut off by the driver circuit 103. Thereby, the semiconductor switching element driving circuit that is robust to the malfunctions due to the noises and capable of cutting off the IGBT 101 at high speed is realized.

Recently, the IGBT or the like has also been used in driving a motor of the electric vehicle or the like in which high voltages are applied. A motor driving circuit of such an electric vehicle is shown in FIG. 12. As shown in this drawing, a three-phase driving circuit, for example, is used for the motor driving circuit.

In such a motor driving circuit, when a load short circuit such that windings in a motor 110 short-circuit each other occurs, or when a short circuit occurs between wirings to each phase, or when an arm short circuit such that IGBTs 111 arranged above and below as shown in FIG. 12 are brought to the on state at the same time because of the malfunctions occurs, an overcurrent (short circuit current) that becomes large to a great extent in a relatively short time is generated. On the other hand, when a motor lock or the like occurs, an overcurrent that is smaller than the short circuit current is generated for a relatively long time.

In case that the conventional semiconductor switching element driving circuit is applied to such a motor driving circuit, as for the overcurrent caused by the motor lock or the like, the IGBT 101 is cut off at high speed by the operation set forth and a flow through the IGBT 101 can be prevented. However, as for the above described short circuit current caused by the load short circuit or the arm short circuit the condenser 105 prevents an instantaneous response. Thus, the flow of the short circuit current through the IGBT 101 cannot be prevented. Furthermore, the short circuit current flowing at this time greatly increases in magnitude (five-fold or more of a rated current, for example) because an extremely large motor driving voltage. Consequently, the IGBT might be damaged.

Additionally, since the conventional semiconductor switching element driving circuit cannot turn off the overcurrent until the delay time T1 passes, the overcurrent is also supplied to the other IGBTs shown in FIG. 12 and it causes a motor system to have a problem.

In light of the points as set forth, the purpose of the invention is to provide a semiconductor switching element driving circuit capable of controlling the overcurrent that increases instantaneously and of conducting the high-speed cutoff of the semiconductor switching element particularly in a device which high voltages are required.

SUMMARY OF THE INVENTION

This invention has been conceived in view of the background as described above and an object of the invention is preferably to prevent a semiconductor switching element from being destroyed due to an overcurrent caused by a short circuit and the like.

According to the present invention, the semiconductor switching element driving circuit comprises a semiconductor switching element having a gate terminal, a first terminal and a second terminal for carrying a main current between the first and second terminals by applying a voltage to the gate terminal, an overcurrent protection circuit for first decreasing the main current at a first slope and then reducing the main current at a second slope steeper than said first slope when the main current becomes a first overcurrent that exceeds a predetermined current value for a period of time equal to or longer than a predetermined period of time, and an overcurrent limiting circuit for instantaneously dropping a voltage applied to the gate terminal when the main current becomes a second overcurrent larger than said first overcurrent within a shorter period of time than said predetermined period of time.

In this manner, when the second overcurrent (short circuit current) is caused by a load short circuit, an arm short circuit or the like, a voltage applied to a gate terminal is dropped instantaneously by the overcurrent limiting circuit so that the overcurrent can be prevented from flowing into the semiconductor switching element. Additionally, when the first overcurrent smaller than the short circuit current that is generated for a relatively long time is caused by a motor lock or the like, the overcurrent protection circuit first decreases the main current at the first inclination and then reduces the main current at the second inclination steeper than the first inclination, whereby the high-speed cutoff of the semiconductor switching element can be conducted while preventing the effect of the jumping voltage due to the wiring inductance. Therefore, the overcurrent which increases instantaneously can be controlled and the high-speed cutoff of the semiconductor switching element can be conducted.

For example, as shown in claim 2, the overcurrent limiting circuit may reduce the voltage of the gate terminal in the case that it becomes a larger current within a shorter period of time than a delay time in the circuit.

According to the other aspect of the present invention the semiconductor switching element driving circuit comprises the overcurrent limiting circuit for instantaneously dropping a voltage of the gate terminal when the main current becomes larger than a first comparison current, and the overcurrent protection circuit for first decreasing the main current at a first inclination when the main current becomes larger than a second comparison current that is lower than the first comparison current and then reducing the main current at a second inclination steeper than the first inclination when the main current becomes smaller than a third comparison current that is lower than the second comparison current.

In this manner, when the main current has become larger than the first comparison current, the gate voltage can be dropped instantaneously by the overcurrent limiting circuit. In addition, the main current is decreased at the first inclination when the main current becomes larger than the second comparison current and the main current is reduced at the second inclination steeper than the first inclination when the main current becomes smaller than the third comparison current. Thus, the high-speed cutoff of the semiconductor switching element can be conducted while the effect of the jumping voltage due to the wiring inductance is prevented. Furthermore, regardless of a period of time after the overcurrent has occurred, the main current is suddenly dropped at the time when the main current has become smaller than the third comparison current so that the overcurrent can also be prevented from inevitably flowing through for a fixed time.

According to another aspect of the present invention, the semiconductor switching element driving circuit comprises a semiconductor switching element having a gate terminal, a first terminal and a second terminal for carrying a main current between the first and second terminals by applying a control voltage to the gate terminal, said semiconductor switching element outputting a detection current substantially proportional to the main current from a detection terminal; and an overcurrent limiting circuit for adjusting the control voltage applied to said gate terminal so that said main current becomes equal to or under a predetermined current value, wherein said overcurrent limiting circuit comprises a current detection resistance connected to a detection terminal for converting said detection current outputted from the detection terminal into a detection voltage, a detection resistance switching unit for decreasing a resistance value of said current detection resistance until said gate voltage applied to the gate terminal is under a reference voltage which is lower than a full-on voltage by which said semiconductor switching element becomes a full on state.

The full on state as described here is a state that the semiconductor device resides in a saturated region and an on resistance becomes smallest.

In this manner, until a control voltage (a gate voltage) reaches a predetermined resistance switching voltage value during current carrying through an electric load (i.e, semiconductor switching element), a detection resistance switching unit reduces the resistance value of the current detection resistance. Thus, a voltage drop by the current detection resistor whose resistance value has been reduced is inputted into an overcurrent protecting unit as a detected voltage. Therefore, in the case that the control voltage is low and a ratio of the detected voltage to the current carrying through the load is great (i.e., the current mirror ratio is small), the resistance value of the current detection resistor is decreased to allow a protecting operation not to be conducted with a small amount of the current carrying through the semiconductor switching element (the reduction in the control voltage by the overcurrent protecting unit).

While in the case that the control voltage is high and the ratio of the detected current to the current carrying through the semiconductor switching element is small (i.e., the current mirror ratio is great), the resistance value of the current detection resistor is held as it is (a value greater than the resistance value for the period of time until the control voltage reaches the resistance switching voltage value) and even a small amount of the detected current can conduct the protecting operation.

BRIEF DESCRIPTION OF THE DRAWINGS

Other objects, features and advantages of the present invention will become more apparent from the following detailed description made with reference to the Note accompanying drawings.

In the drawings:

FIG. 8 is a diagram depicting the Vce-Ic characteristics of the IGBT shown in FIG. 5;

FIG. 9A is a diagram depicting time chart of a main IGBT current and in the case of using the IGBT shown in FIGS. 5A and 5B;

FIG. 9B is a diagram depicting a time chart of an emitter-collector voltage Vce in the case of using the IGBT shown in FIGS. 5A and 5B;

DESCRIPTION OF THE EMBODIMENTS

Figure 1:
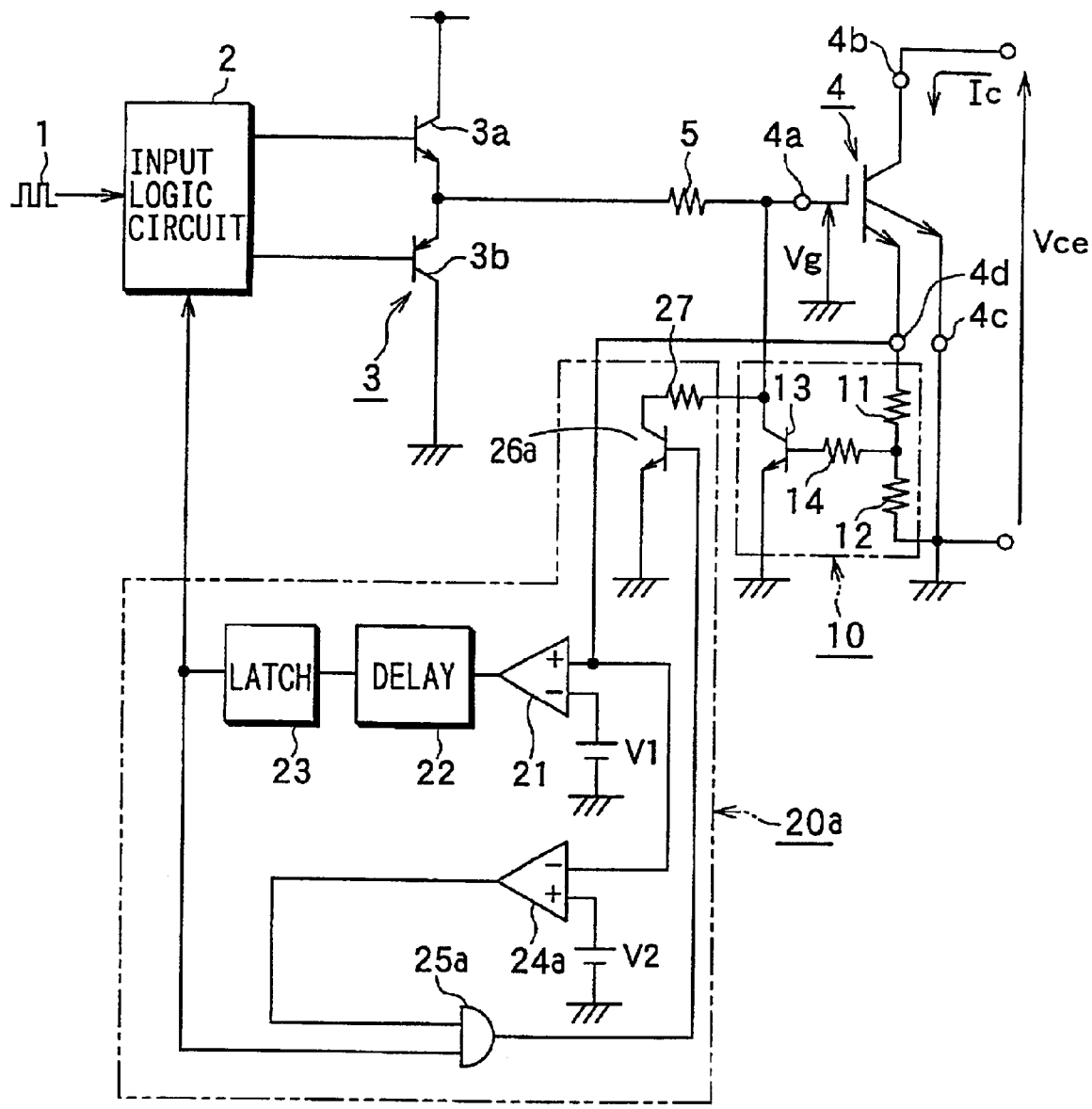
FIG. 1 is a diagram depicting a circuitry of a semiconductor switching element driving circuit of a first embodiment of the invention.

Specific embodiments of the present invention will now be described hereinafter with reference to the accompanying drawings in which the same or similar component parts are designated by the same or similar reference numerals.

First Embodiment

Figure 12:
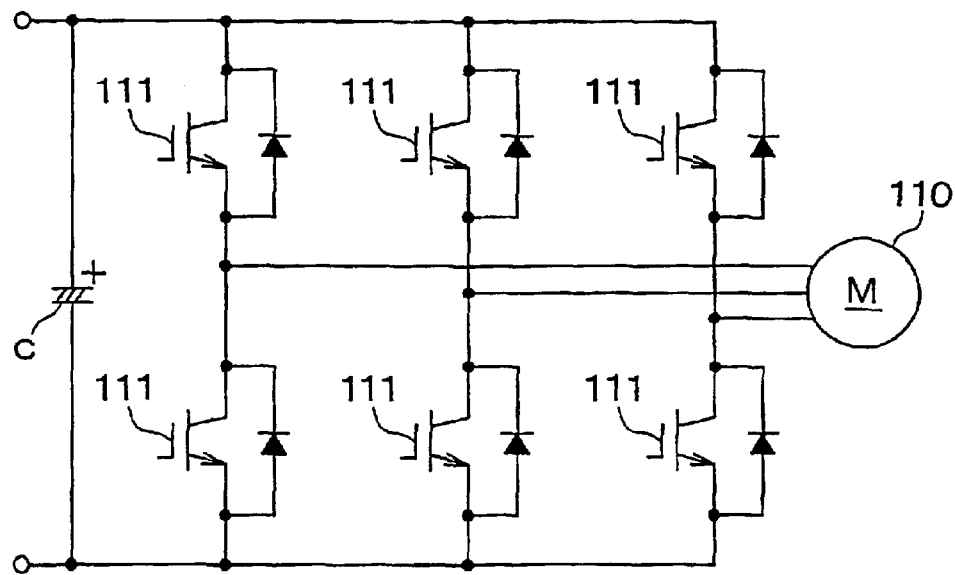
FIG. 12 is a diagram depicting a circuitry in the case of using the semiconductor switching element driving circuit as a motor driving circuit.

FIG. 1 illustrates a circuitry of a semiconductor switching element driving circuit to which a first embodiment of the invention is applied. This semiconductor switching element driving circuit is for use in driving each of semiconductor switching elements of a motor driving circuit of the electric vehicle or the like as shown in FIG. 12. Hereafter, the description of the semiconductor switching element driving circuit will be made according to FIG. 1.

The semiconductor switching element driving circuit shown in FIG. 1 comprises an input logic circuit 2 to which an input signal 1 such as a PWM signal or the like is inputted, a driver circuit 3 controlled by the input logic circuit 2 to turn it on/off, an IGBT 4 for performing switching in response to the turn on/off of the driver circuit 3, an overcurrent limiting circuit 10 for limiting a flow of an overcurrent (short circuit current) that flows to the IGBT 4 and becomes enormously large in a relatively short time, and an overcurrent protection circuit 20a for protecting the IGBT 4 from the flow of an overcurrent smaller than the short circuit current that is generated in the IGBT 4 when a motor lock or the like occurs.

The driver circuit 3 is configured of a push-pull circuit made of a source driver 3a and a sink driver 3b which are switched on/off by the input logic circuit 2. A connecting point of the source driver 3a and the sink driver 3b is connected to a gate terminal 4a of the IGBT 4 through a gate resistor 5. The input logic circuit 2 controls a collector current Ic between a collector terminal 4b as a first terminal and an emitter terminal 4c as a second terminal by applying a voltage to a gate terminal 4a of the IGBT 4 through the driver circuit 3.

The overcurrent limiting circuit 10 is provided with sense resistors 11 and 12 connected to a sense terminal 4d of the IGBT 4 and an overcurrent limiting transistor 13 having a collector connected to the gate terminal 4a of the IGBT 4, a emitter connected to the ground.

Additionally, the sense terminal 4d is a current detecting terminal to which a current proportional to the collector current (main current) IC of the IGBT 4 is applied. Furthermore, the overcurrent limiting circuit 10 is provided with a base current limiting resistor 14 connected between an interconnection between both of the sense resistors 11 and 12 and a base of the overcurrent limiting transistor 13. By such a configuration, when a sense current is carried though the sense terminal 4d, the sense resistors 11 and 12 serve as a current detecting unit to turn on the overcurrent limiting transistor 13 according to a voltage divided by these sense resistors 11 and 12.

However, a resistance value of each sense resistor 11 or 12 is allocated so that a predetermined condition explained below is satisfied.

When an overcurrent that rapidly increases in a relatively short time is about to flow though the IGBT 4, a voltage at the interconnection between sense resistors 11 and 12 becomes equal to a predetermined base-emitter voltage Vbe of the overcurrent limiting transistor 13 to turn on the overcurrent limiting transistor 13. In other words, when the collector current Ic has reached an i1 (a first comparison current) shown in a mathematical expression 1 and shown in FIG. 2A, the overcurrent limiting transistor 13 is turned on by a divided voltage applied with the sense resistors 11 and 12.

$$i1 = m \times Vbe/R1 \qquad \text{[mathematical expression 1]}$$

Where m is a ratio of the collector current Ic to the sense current of the IGBT 4, that is, the collector current Ic is m-fold of the sense current ($10^4$-fold, for example). Further, R1 is the resistance value of the resistor 12.

The overcurrent limiting circuit 10 shown in FIG. 1 does not have a condenser 105 that was added in a conventional circuitry as shown in FIG. 5 and does not have a delay time generated by the condenser 105.

Additionally, as described above, the overcurrent limiting circuit 10 limits the collector current Ic in the case that the overcurrent becoming enormously large in the relatively short time has occurred.

The relatively short time referred here is equivalent to a predetermined period of time that the overcurrent cannot be suppressed by the overcurrent protection circuit 20a, that is, the relatively short time is shorter than a delay time T2 in the circuit described later.

Therefore, in the case that the overcurrent exceeds a tolerance level in a time shorter than the delay time T2 in the circuit, the collector current Ic is limited by the overcurrent limiting circuit 10.

The overcurrent protection circuit 20a has a first comparator 21 as a first comparison unit for comparing a potential of the sense terminal 4d of the IGBT 4 with a voltage V1, a delay circuit 22 for delaying an output of the first comparator 21 for a predetermined period of time (the delay time T2) to transmit to a latch circuit 23, and the latch circuit 23 for holding an output of the delay circuit 22 for a fixed time.

Furthermore, the overcurrent protection circuit 20a has a second comparator 24a as a second comparison unit for comparing the potential of the sense terminal 4d with a voltage V2, an AND circuit 25a to which output signals of the latch circuit 23 and the second comparator 24a are inputted and the overcurrent protection transistor 26a controlled to be turned on/off based on a signal from the AND circuit 25a.

A collector of the overcurrent protection transistor 26a is connected to the gate terminal 4a of the IGBT 4 through a resistor 27, whereby the overcurrent protection transistor 26a works to reduce a gate voltage of the IGBT 4.

Further, the comparison voltage V1 of the first comparator 21 is set equal to a voltage applied to the resistors 11 and 12 (the sense terminal 4d) at the time when the collector current Ic has reached an i2 (second comparison current) expressed by a mathematical expression 2. Note that, R2 is the resistance value of the resistor 11.

$$i2 = m \times V1/(R1+R2) \qquad \text{[mathematical expression 2]}$$

Additionally, the comparison voltage V2 of the second comparator 24a is set equal to a voltage applied to the sense terminal 4d at the time when the collector current Ic has reached an i3 (third comparison current) expressed by a mathematical expression 3.

$$i3 = m \times V2/(R1+R2) \qquad \text{[mathematical expression 3]}$$

Namely, the comparison voltage V1 of the first comparator 21 and the comparison voltage V2 of the second comparator 24a satisfy a relationship V1>V2, and the first comparator 21 outputs an inverted signal with respect to an overcurrent occurring for a relatively long time before the second comparator 24a outputs a inverted signal.

Additionally, although the case of the overcurrent occurring for a relatively long time is described here, this relatively long time is equivalent or more to the delay time T2 in the circuit generated by the delay circuit 22.

Next, an operation of the semiconductor switching element driving circuit described above will be explained. FIGS. 2A to 2D illustrate timing charts in the case that the overcurrent has occurred, and show the collector current Ic of the IGBT 4, the output signal of the latch circuit 23, the gate voltage Vg of the IGBT 4, and an emitter-collector voltage Vce of the IGBT 4, respectively.

When a load short circuit, an arm short circuit or the like has occurred as shown by a period of time ta in FIG. 2A, as expressed by one dotted chain line, the overcurrent becomes enormously large within a relatively short time and this large overcurrent flows through the IGBT 4 instantaneously (in a relatively short time).

However, when the collector current Ic reaches the i1, the voltage at the interconnection between the resistors 11 and 12 rise to the base-emitter voltage Vbe of the overcurrent limiting transistor to turn on the overcurrent limiting transistor 13 by the sense current carried through the sense terminal 4d. Thus, the gate voltage of the IGBT 4 is controlled to limit an increase in the collector current Ic.

Figure 11:
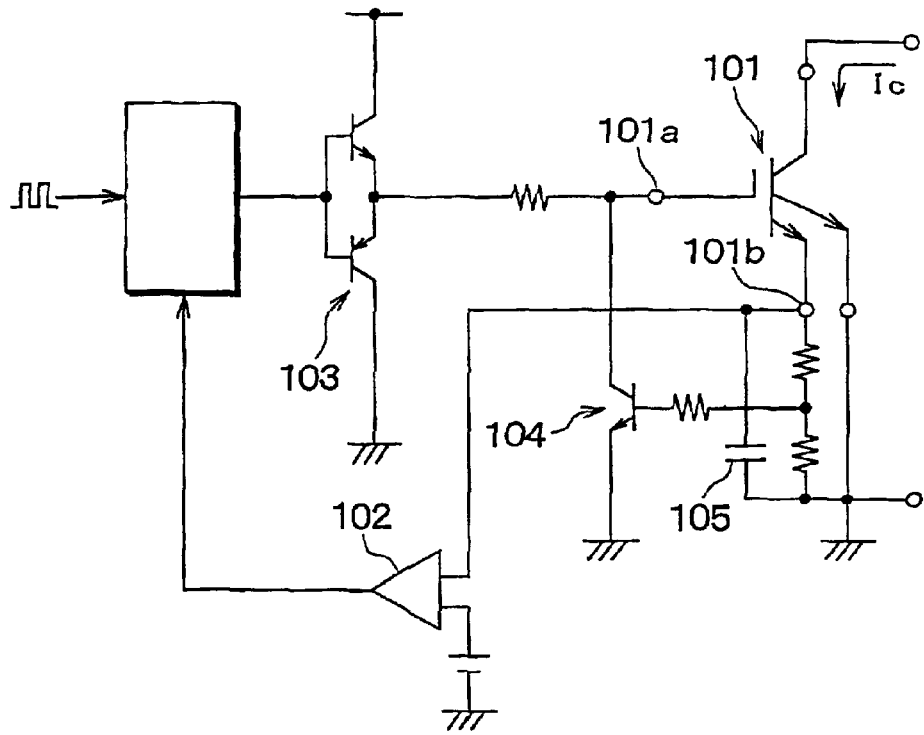
FIG. 11 is a diagram depicting a circuitry of a conventional semiconductor switching element driving circuit.

At this time, since the condenser 105 (referring to FIG. 11) for fixing potentials in the sense terminal 4d is not disposed in this circuit, a turn-on time of the overcurrent limiting transistor 13 becomes short sufficiently. Therefore, an increase in the collector current Ic can be limited instantaneously so that the IGBT 4 can be prevented from being carried through the enormous overcurrent and being broken.

Furthermore, in the case described above, since the collector current Ic exceeds the i2, an output signal of the first comparator 21 is changed from a low-level to a high-level. Then, after this output signal has been delayed by the time T2 in the delay circuit 22, the output signal is held by the latch circuit 23 and the output signal of the latch circuit 23 becomes a high-level.

Subsequently, when the high-level signal from the latch circuit 23, i.e. a fail signal is inputted to the input logic circuit 2, the input logic circuit 2 turns on the sink driver 3b. Thus, the gate voltage of the IGBT 4 is dropped and the collector current Ic decreases gently with a first inclination.

At this time, although a jumping voltage occurs between the collector and the emitter of the IGBT 4 by a −dI/dt in a gently decreasing of the collector current Ic, the collector current Ic is set to decrease at a ratio having the gentle first inclination, whereby the jumping voltage does not become large.

Then, when the collector current Ic becomes equal to or under the i3, the output signal of the second comparator 24a becomes a high-level. As a result, the AND circuit 25a receives the high-level signal held by the latch circuit 23 and the high-level signal of the second comparator 24a, and then the AND circuit 25a outputs a high-level signal to turn on the overcurrent protection transistor 26a.

Thus, the gate voltage of the IGBT 4 is rapidly dropped to 0V, and the collector current Ic decreases rapidly with a second inclination steeper than the first inclination to cut off the IGBT 4 at a high speed.

Furthermore, when the IGBT 4 is cut off, the jumping voltage also occurs between the collector and the emitter of the IGBT 4 by the −dI/dt in a rapidly decreasing the collector current Ic.

On the contrary, since a cutoff of the IGBT 4 is conducted according to a magnitude of the collector current Ic, in the case that the i3 is set to a value allowing the jumping voltage to be suppressed sufficiently, a high-speed cutoff of the IGBT 4 can be conducted so as not to be affected by the jumping voltage.

Additionally, since the IGBT 4 is cut off at the high speed when the collector current Ic becomes equal to or less than the current i3 regardless of the period of time after the overcurrent has occurred, the overcurrent does not inevitably flow for a fixed time and the overcurrent can be prevented from being fed to the other IGBTs 4.

On the other hand, as shown by a period of time tb in FIG. 2A, when the motor lock or the like occurs, the overcurrent smaller than the short circuit current tends to occur for a relatively long time.

In this case, since the collector current Ic exceeds the i2 but does not exceeds the i1, the gate voltage of the IGBT 4 is dropped and the collector current Ic starts to decrease at the first inclination after the time T2 has passed.

After that, as described in the case of the period of time ta, the collector current Ic decreases and the IGBT 4 is cut off at the high speed.

In this manner, in the semiconductor switching element driving circuit of the invention, when a large current equal to or above a predetermined level i1 is detected, the collector current Ic is instantaneously limited with no delay time.

In the case that a middle current i2 smaller than the aforementioned predetermined level i1 is detected, the delay time is formed to turn off the IGBT 4 softly for decreasing the collector current. Moreover, the IGBT 4 is turned off rapidly at the time when the current has reached a predetermined small current i3.

In other words, a three-stage current control is conducted in the case that when the collector current Ic becomes a large current i1, it is dropped instantaneously, when the collector current Ic becomes a middle current i2, it is dropped to a small current i3, and when the collector current Ic becomes the small current i3, it is further decreased.

After all, the circuit shown in FIG. 1 can respond both when the overcurrent becomes enormously for a relatively short time and when the overcurrent is generated for a relatively long time. In any case, the IGBT 4 can be prevented from being carried through the overcurrent that can damage the IGBT.

Additionally, the predetermined level i1, i2 and i3 in this embodiment is modified according to objects in which the IGBT 4 is used. For example, in the case that the IGBT 4 is used in an electric vehicle, the i1 is set approximately 1200A, the i2 is set approximately 800A and the i3 is set approximately 500A.

Second Embodiment

Figure 3:
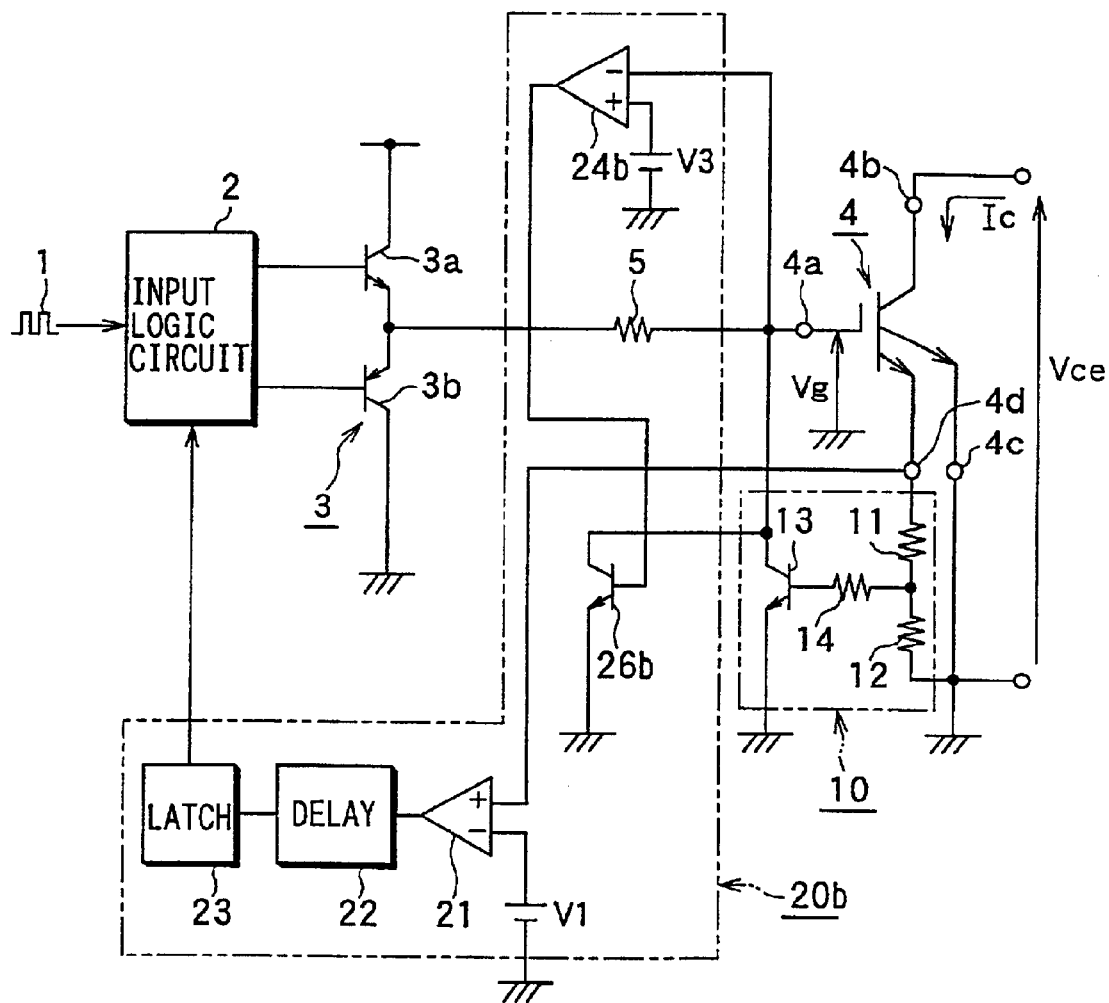
FIG. 3 is a diagram depicting a circuitry of a semiconductor switching element driving circuit in a second embodiment of the invention.

FIG. 3 illustrates a circuitry of a semiconductor switching element driving circuit in a second embodiment. The semiconductor switching element driving circuit in this embodiment is partially modified the circuitry with respect to the first embodiment and thus only different portions will be described.

As shown in FIG. 3, the semiconductor switching element driving circuit in this embodiment has different configuration of an overcurrent protection transistor 26b from the overcurrent protection transistor 26a shown in FIG. 1. That is, in a second comparator 24b, the gate voltage of an IGBT 4 is compared with a predetermined voltage V3. Moreover, a change in a decreasing ratio of the collector Ic is controlled by an overcurrent protection transistor 26b based on an output of this second comparator 24b. Namely, the comparator 24b serves as the comparator 24a in the first embodiment. It is noted that a circuit for turning off the transistor 26b after the IGBT 4 is cut off is not shown in FIG. 3.

In this manner, even in the case that the overcurrent protection transistor 26b is turned on when the gate voltage of the IGBT 4 has reached a predetermined potential, the same effect as in the first embodiment can be obtained.

Third Embodiment

Figure 4:
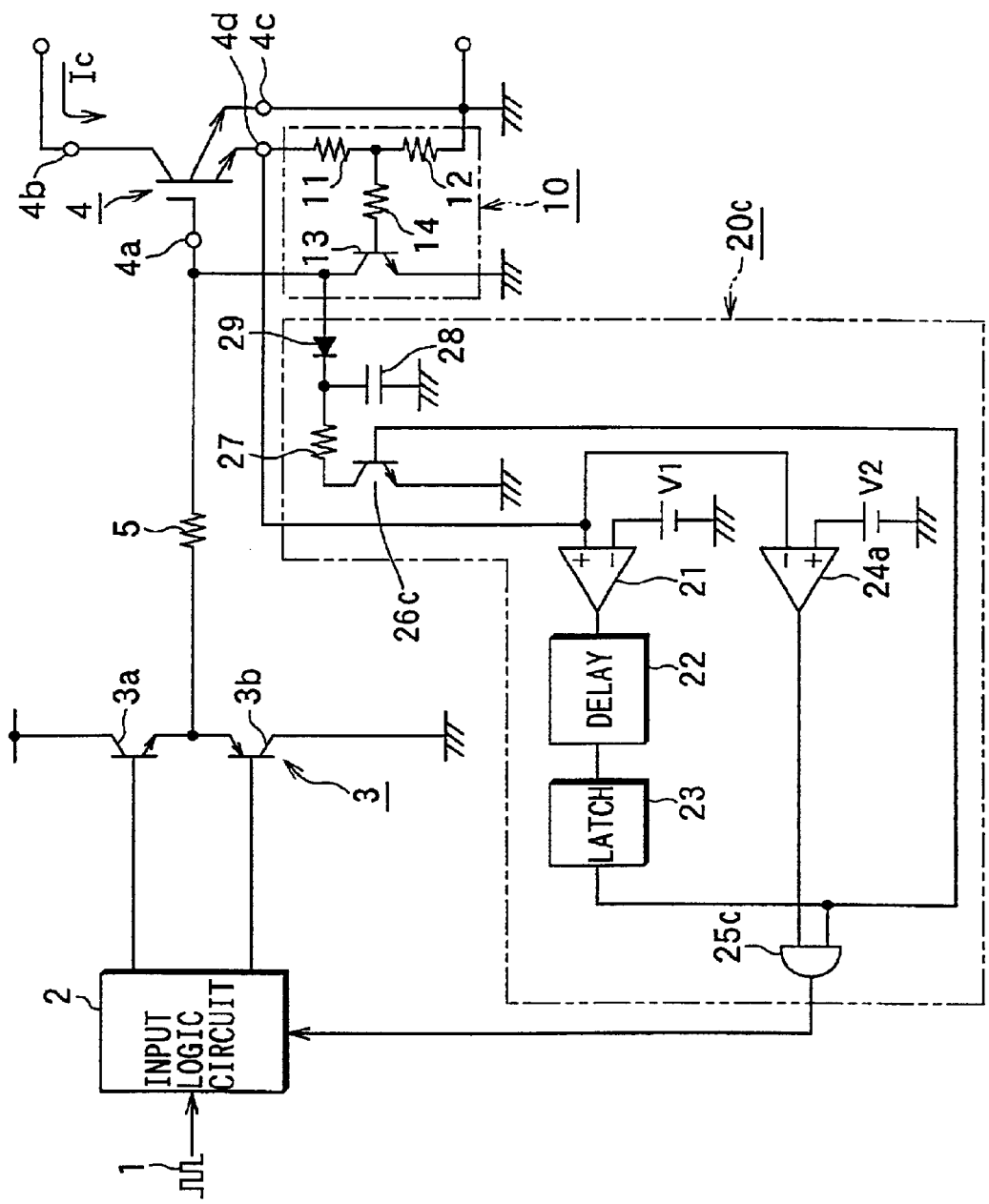
FIG. 4 is a diagram depicting a circuitry of a semiconductor switching element driving circuit in a third embodiment of the invention.

FIG. 4 illustrates a circuitry of a semiconductor switching element driving circuit in a third embodiment. The semiconductor switching element driving circuit in this embodiment is partially modified the circuitry with respect to the first embodiment and thus only different portions will be described.

As shown in FIG. 4, a turning on/off of an overcurrent protection transistor 26c is controlled according to an output signal of a latch circuit 23. Additionally, the input logic circuit 2 controls turning on/off of a driver circuit 3 based on an output of an AND circuit 25c to which output signals of the latch circuit 23 and the second comparator 24a are inputted.

Figure 2:
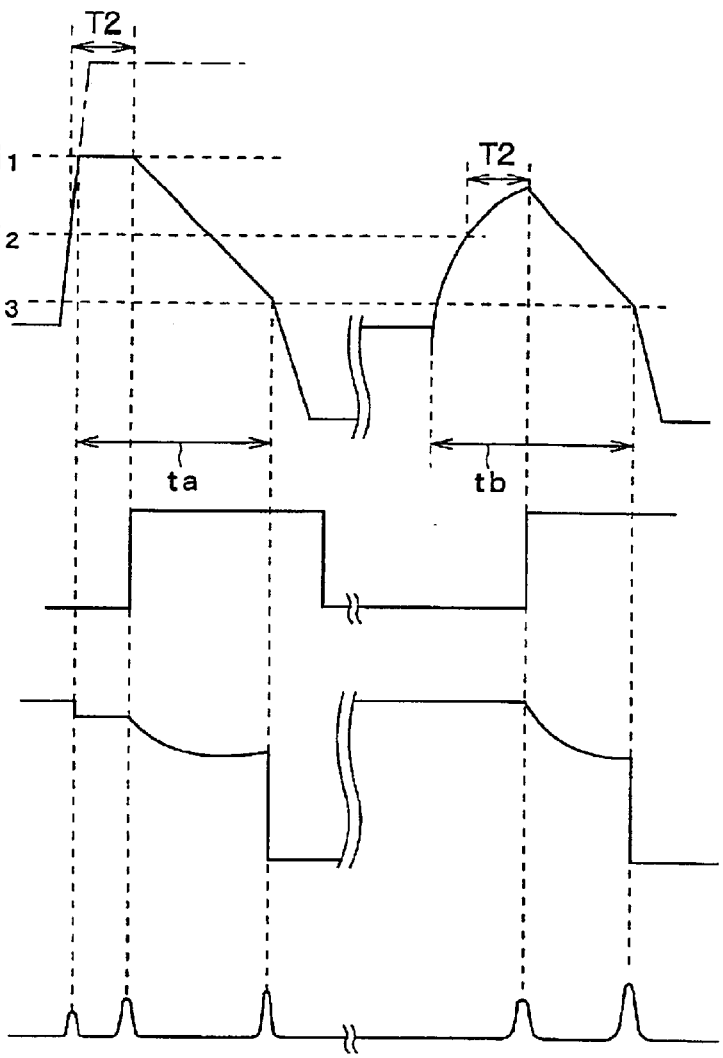
FIG. 2A is a diagram depicting a time chart of a collector current IC shown in FIG. 1.
FIG. 2B is a diagram depicting a time chart of an output of latch circuit 23 shown in FIG. 1.
FIG. 2C is a diagram depicting a time chart of a gate voltage Vg of an IGBT 4 shown in FIG. 1.
FIG. 2D is a diagram depicting a time chart of a voltage Vce between a collector and an emitter of the IGBT 4 shown in FIG. 1.

Therefore, when the overcurrent is about to occur for a relatively long time, the overcurrent protection transistor 26c is turned on to decrease the collector current at the first inclination as shown in FIG. 2 and subsequently the sink driver 3b of the driver circuit 3 is turned on to decrease the collector current at the second inclination steeper than the first inclination and thus the IGBT 4 is cut off at the high speed.

As described above and shown in FIG. 4, in the case that the collector current Ic is decreased from the middle current i2 to the small current i3, the overcurrent protection transistor 26c may be used, and in the case that it is further decreased from the small current i3, the driver circuit 3 may be used.

Additionally, when a resistance value of the resistor 5 between the driver circuit 3 and the gate terminal 4a of the IGBT 4 is made small sufficiently, a decrease of the gate voltage in the IGBT 4 can be made fast sufficiently.

Furthermore, in this embodiment, a resistor 17 is connected in series between the gate terminal 4a of the IGBT 4 and a collector of the overcurrent protection transistor 26c while a condenser 28 is connected in parallel with the transistor 26c. Thus, a time constant determined by the resistor 27 and the condenser 28 can determine the first inclination at which the collector current Ic is dropped from the middle current i2 to the small current i3. Consequently, a ratio of a decrease in the collector current Ic can be set according to objects in which the semiconductor switching element driving circuit uses by appropriately selecting the resistor 27 and the condenser 28.

Moreover, a diode 29 is connected between the gate terminal 4a of the IGBT 4 and the condenser 28. This diode 29 works to prevent a backflow of a current to the gate terminal 4a due to a voltage stored in the condenser 28.

Fourth Embodiment

In this embodiment, a specific device structure of the IGBT 4 used in each of the embodiments described above will be described As shown in FIG. 5B, the IGBT 4 is formed on a $p^+$-type substrate 30. On a front surface of the $p^+$-type substrate 30, a p-type base layer 33 is formed as well as an $n^+$-type layer 31 and an $n^-$-type layer 32. A trench 34 is formed so as to penetrate the p-type base layer 33 (base region 33). In this trench 34, a gate electrode 36 is formed through a gate oxide film 35. An $n^+$-type emitter regions 37 are formed on sides of the trench 34. Furthermore, an insulating film 38 is formed so as to cover a part of the $n^+$-type emitter region 37 and the top of the trench 37. An emitter electrode 39 to be connected to the $n^+$-type emitter region 37 and the p-type base layer 33 is formed through a contact hole 38a formed in the insulating film 38. A collector electrode 40 is formed on a back surface of the $p^+$-type substrate 30.

In the IGBT 4 described above, when a voltage is applied to the gate electrode 36, channels are formed in the p-type base layers 33 at sides of the trenches 34, whereby a current is carried between an emitter and a collector through these channels.

Figure 5A:
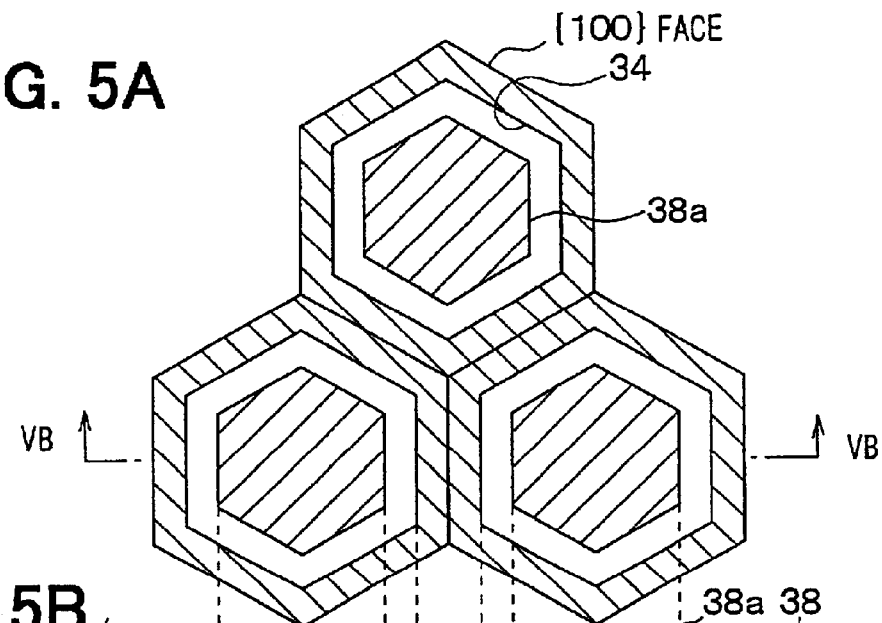
FIG. 5A is a plan view of the IGBT in a fourth embodiment of the invention.
Figure 5B:
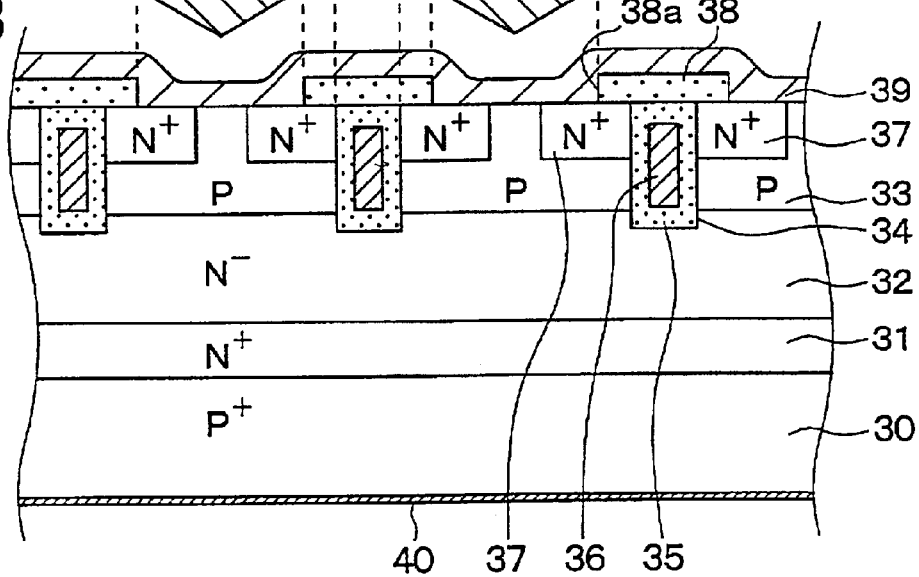
FIG. 5B is a sectional view taken along line VB—VB in FIG. 5A.

Each cell of the IGBT 4 is configured a hexagonal shape so that a top geometry of the contact hole 38 (i.e. a contact part of the emitter electrode 39), the gate electrode 36, the trench 34, or the base region 33 forms the hexagonal shape as shown in FIG. 5. Moreover, a plane direction of one side of the trench 34 in the hexagonal shape is set {100} and the other sides are set as plane directions of high order higher than {100} plane. Three unit cells are shown in FIG. 5A.

Figure 6:
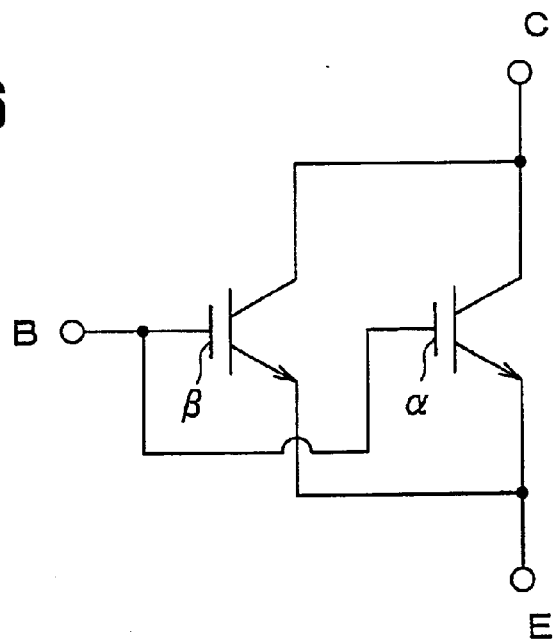
FIG. 6 is a diagram depicting an equivalent circuit of the IGBT shown in FIGS. 5A and 5B.

In each cell in the IGBT 4, since a plane direction of each channel is different from each other, a threshold voltage Vt varies in each channel. It is known that a threshold voltage Vt becomes small on {100} plane as compared with the sides of the plane directions higher than {100}. Therefore, the IGBT 4 is expressed by an equivalent circuit as shown in FIG. 6.

Figure 7:
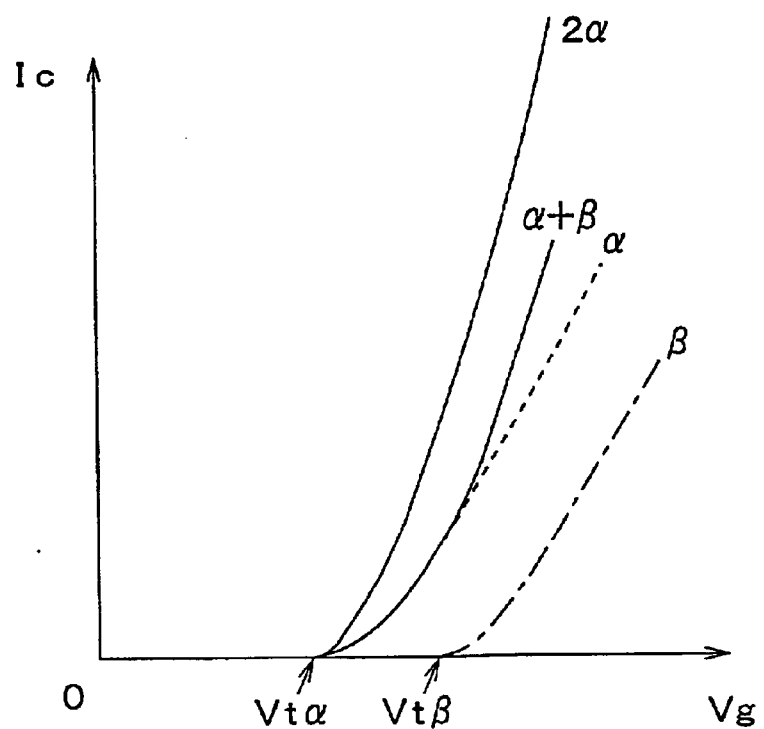
FIG. 7 is a diagram depicting the Vg-Ic characteristics of the IGBT shown in FIGS. 5A and 5B.

The IGBT 4 expressed by this equivalent circuit connects an IGBT α to an IGBT β substantially in parallel. Each of those IGBTs has a different threshold voltage Vt. As shown in a Vg-Ic characteristics in FIG. 7, a characteristics of the IGBT 4 are expressed as a solid line α+β. That is, a combination of characteristics in the IGBT α and the IGBT β becomes the characteristics of the IGBT 4. The characteristics of the IGBT 4 are gentler than those of, for example, a planar-type IGBT in which each cell has a same threshold voltage Vt. On this account, the Vce-Ic based on Vg characteristics of the IGBT 4 is expressed as FIG. 8, the Ic shifts and rises in two stages with respect to the Vce.

Therefore, in the case that the IGBT 4 is configured as described above, a variation of the collector current Ic and the emitter-collector voltage Vce are expressed as FIG. 9. A variation point at which an inclination of the collector current Ic varies divides into two stages and the jumping voltage in the emitter-collector voltage Vce is reduced.

As described above, the channel of the IGBT 4 is configured of at least two sides having a different plane direction and the threshold voltage Vt of each side is to vary, whereby, the Vg-Ic characteristics can be made gentle and the jumping voltage in the emitter-collector voltage Vce can be reduced.

Fifth Embodiment

In the fourth embodiment, although the top geometry of the IGBT 4 is formed in a hexagonal shape forms the channel having a different threshold voltage Vt, a modification like in this embodiment may be acceptable.

Figure 10A:
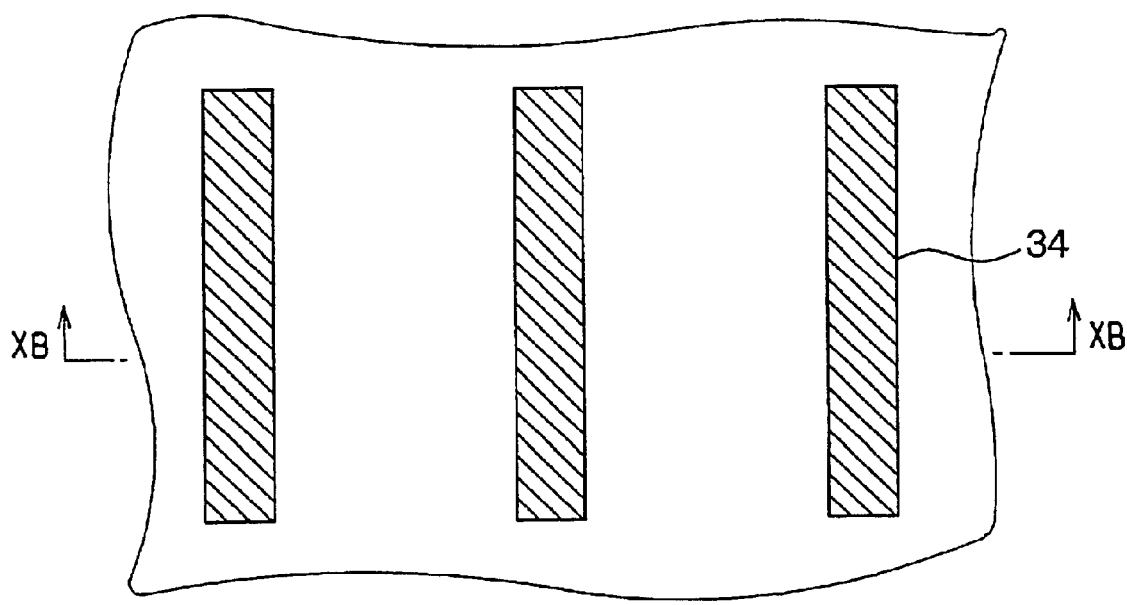
FIG. 10A is a plan view of the IGBT in a fifth embodiment of the invention.
Figure 10B:
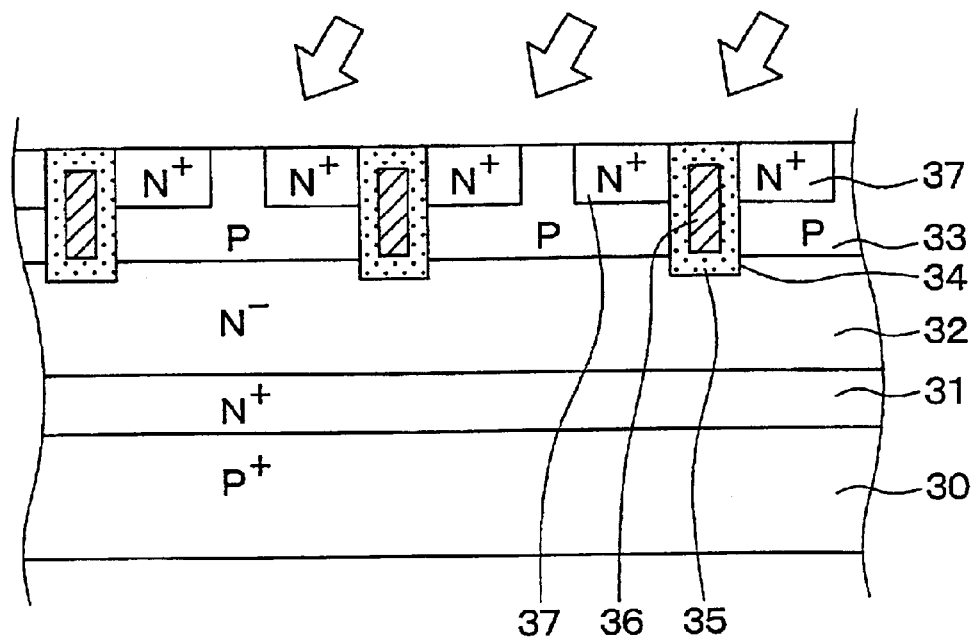
FIG. 10B is a sectional view taken along line XB—XB in FIG. 10A.

FIG. 10A illustrates a top geometry of an IGBT 4 in the embodiment. As shown in this drawing, the embodiment has such a configuration that a top geometry of the IGBT 4 is formed in a striped shape and a channel is formed on both sides of a trench arranged in stripes. Since the cross section of the IGBT 4 shown in FIG. 10B is depicted similar to that shown in FIG. 5B, only different portions will be described here.

The IGBT 4 in the embodiment has different carrier densities in a region located on both sides of a trench in a p-type base layer, i.e. in a region where the channel is formed, whereby a different threshold voltage Vt of the channel is formed on the both sides of the trench. The IGBT 4 of such a configuration is formed by conducting an ion implantation obliquely with respect to a surface parallel with a surface of the substrate 30 for adjusting the threshold voltage Vt as depicted by arrows in FIG. 10B and performing the ion implantation only on one side of the trench.

In this manner, two threshold voltages Vt can also be provided in the IGBT 4 so that the same effect as described in the fourth embodiment can be obtained even if the plane direction of the region where the channel is formed is the same.

In the embodiments described above, although the delay time in the circuit is formed by the delay circuit 22, the delay time is formed inevitably without actually disposing the delay circuit 22. In this case, when the delay time inherent in the circuit is formed as long as a period of time not causing the malfunctions due to the noises equivalent to the overcurrent, the delay circuit 22 is not necessary.

In the fourth and fifth embodiments described above, although a trench-type IGBT (MOS) having the hexagonal cells or the striped cells is shown in FIGS. 5A and 10A, the same effect can also be obtained by a planar-type MOS having hexagonal cells. Even a conventional planar-type MOS may be configured to have two kinds of Vts, α and β in FIG. 6, when ions are implanted into channel regions on a half of cells by using a mask.

Additionally, in the fourth and fifth embodiments described above, although examples adopting a device structure where the channels having different threshold voltages Vt are shown as the IGBTs 4 described in the first to third embodiments, when the configurations described in the fourth and the fifth embodiments are used for a switching element used as a power device, the same effects as the embodiments described above can be obtained with respect to any circuitry.

Sixth Embodiment

In this embodiment, especially, the overcurrent limiting circuit 10 described in above embodiments is modified. Therefore, the overcurrent protection circuit 20a to 20c will not be explained in this embodiment.

In such a overcurrent limiting circuit 10 disclosed in the above-mentioned embodiments, a total voltage including a voltage applied between the sense terminal 4d and the gate terminal 4a and a voltage applied to the sense resistors 11 and 12 is equivalent to a voltage between the gate terminal 4a and the emitter terminal 4c of the IGBT 4. Thus, when the voltage drop occurs in the sense resistors 11 and 12, the voltage between the gate terminal 4a and the sense terminal 4d of course becomes lower than that between the gate terminal 4a and the emitter terminal 4c.

Figure 14:
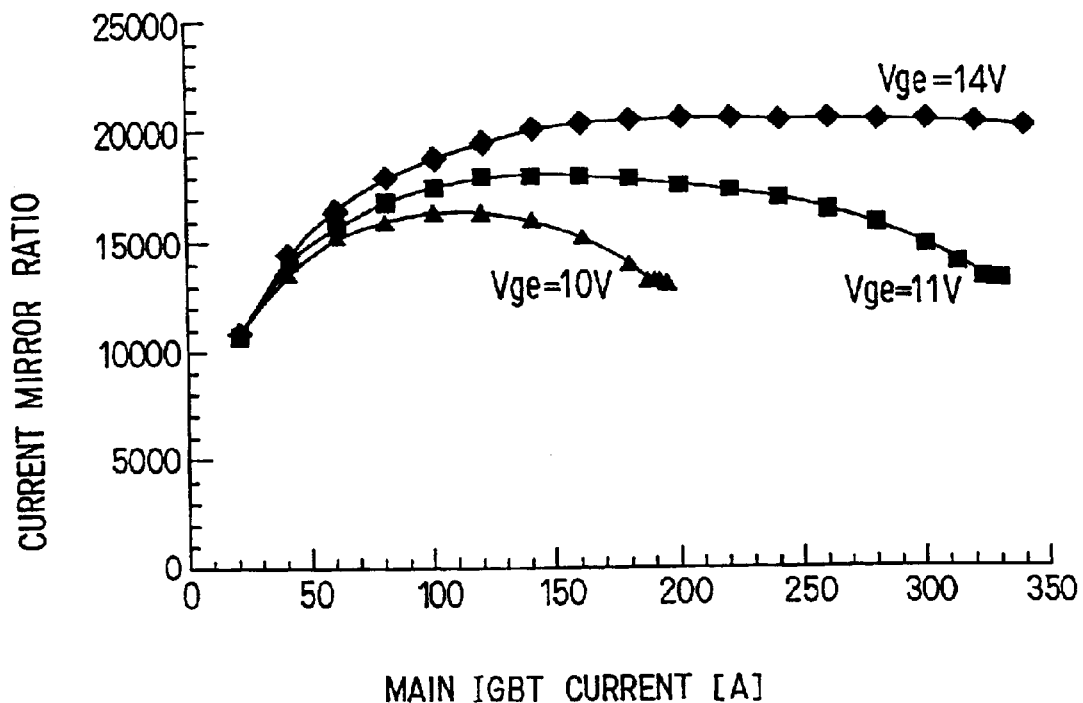
FIG. 14 is a diagram depicting the variation of the current mirror ratio of the gate voltage Vge to the main current when the gate voltage Vge is held constant.

Therefore, as shown in FIG. 14, a current ratio of the collector current IC to the sense current (hereafter, it is referred to as a current mirror ratio) varies depending on the gate voltage. In addition, the current mirror ratio changes according to the main IGBT current (collector current IC) as well.

Hereinafter, the collector current IC is referred to as a main IGBT current, and the sense current is referred to as a sub IGBT current.

FIG. 14 is an illustration depicting a variation of the current mirror ratio of the gate voltage Vge to the main IGBT current when the gate voltage Vge is held constant, showing that the current mirror ratio varies depending on the value of the gate voltage. Namely, when the gate voltage is low, the voltage generated at sense terminal 4d also becomes the value as low as that can be neglected. Thus, the voltage between the gate terminal 4a and the emitter terminal 4c does not greatly differ from the voltage between the gate terminal 4a and the sense terminal 4d.

However, when the gate voltage becomes greater, the voltage generated at sense terminal 44 also becomes greater. Therefore, the voltage between the gate and the sense terminal 44 decreases and thus the sub IGBT current reduces. In other words, as shown in FIG. 14, the greater the gate voltage becomes, the smaller the sub IGBT current becomes relative to the main IGBT current. As a result, the current minor ratio becomes great according to the gate voltage.

On this account, the current (≈main IGBT current) that the overcurrent limiting circuit 10 operates in the case that the overcurrent starts to flow at the turn-on time (at the time when the gate voltage is low) when the IGBT switches the off state to the on state (Situation 1) becomes smaller than the current that the overcurrent limiting circuit 10 operates in the case that the overcurrent flows when the IGBT is steadily in the on state (Situation 2). Hereafter, this condition will be described in detail.

Initially, in the case of the Situation 2, since the current mirror ratio is great and thus the sub IGBT current becomes smaller with respect to the main IGBT current, the sub IGBT current does not increase so much even though the overcurrent flows.

In other words, in the case that the current mirror ratio is great, i.e., the sub IGBT current is not greater so much while the main IGBT current has already become the overcurrent, the resistance value of the sense resistor needs to be increased to secure that the IGBT can be protected from the overcurrent even if the sub IGBT current is small.

On the other hand, in the case of the situation 1, the current mirror ratio is small as compared with the Situation 2 and when the overcurrent starts to flow, the sub IGBT current also increases. At this time, if the resistance value of the sense resistor is set to be as large as that in the case of the Situation 2, the overcurrent limiting circuit 10 may operate (the overcurrent limiting transistor 26 is turned on) before the main IGBT current becomes the overcurrent, and thus the resistance value of the sense resistor needs to be decreased.

Figure 15:
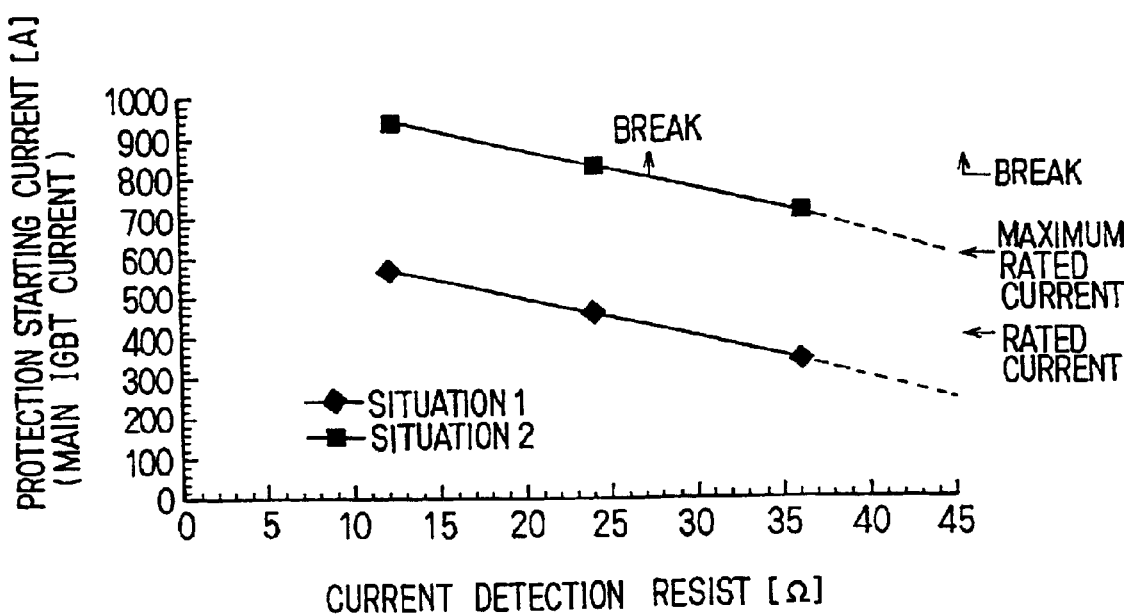
FIG. 15 is a diagram showing the protection starting current with respect to the current detection resistance value in the Situations 1 and 2.

In short, in order that the overcurrent limiting circuit 10 operates by the same main IGBT current in both of the Situations 1 and 2, the sense resistor in the Situation 2 should be set greater than that in the Situation FIG. 15 is an illustration depicting a protection starting current (main IGBT current) respective to the sense resistor value in the Situations 1 and 2, showing that when the IGBT is to be protected using the sense resistor having a certain resistance value. The main IGBT current in the Situation 2 is greater than the main IGBT current that the overcurrent limiting circuit operates in the Situation 1.

For example, in the case that the IGBT having 400A of a rated current, 600A of a maximum rated current and 800A or more of a breakdown current is protected, in order that the over current limiting circuit 10 does not operate even when the rated current (400A) is carried during the normal operation, the sense resistor is required to set approximately 30 Ω or less.

Furthermore, in order to provide the protection at the maximum rated current (600A) or less in the Situation 1, the sense resistor is required to set approximately 10 Ω or more.

However, when the value is set approximately 27 Ω or under at this time, since the IGBT is broken in the case that the abnormality in the Situation 2 occurs, it is necessary to set ranging within about 27 to 30 Ω in practice. While in order to provide the protection at the maximum rated current (600A) or under for the abnormality of the Situation 2, the sense resistor is required to set approximately 45 Ω or above. In the sense resistor is provisionally set 45 Ω, the over current limiting circuit 10 will operate at approximately 250A in the abnormality of the Situation 1. Therefore, even the rated current (400A) cannot be carried in the Situation 1.

A overcurrent limiting circuit in this embodiment described hereinafter works to surely protect the semiconductor device from the overcurrent based on the sub IGBT current (sense current) in the semiconductor device provided with a sense terminal for sensing the sub IGBT current proportional to the main IGBT current (collector current IC).

Figure 13:
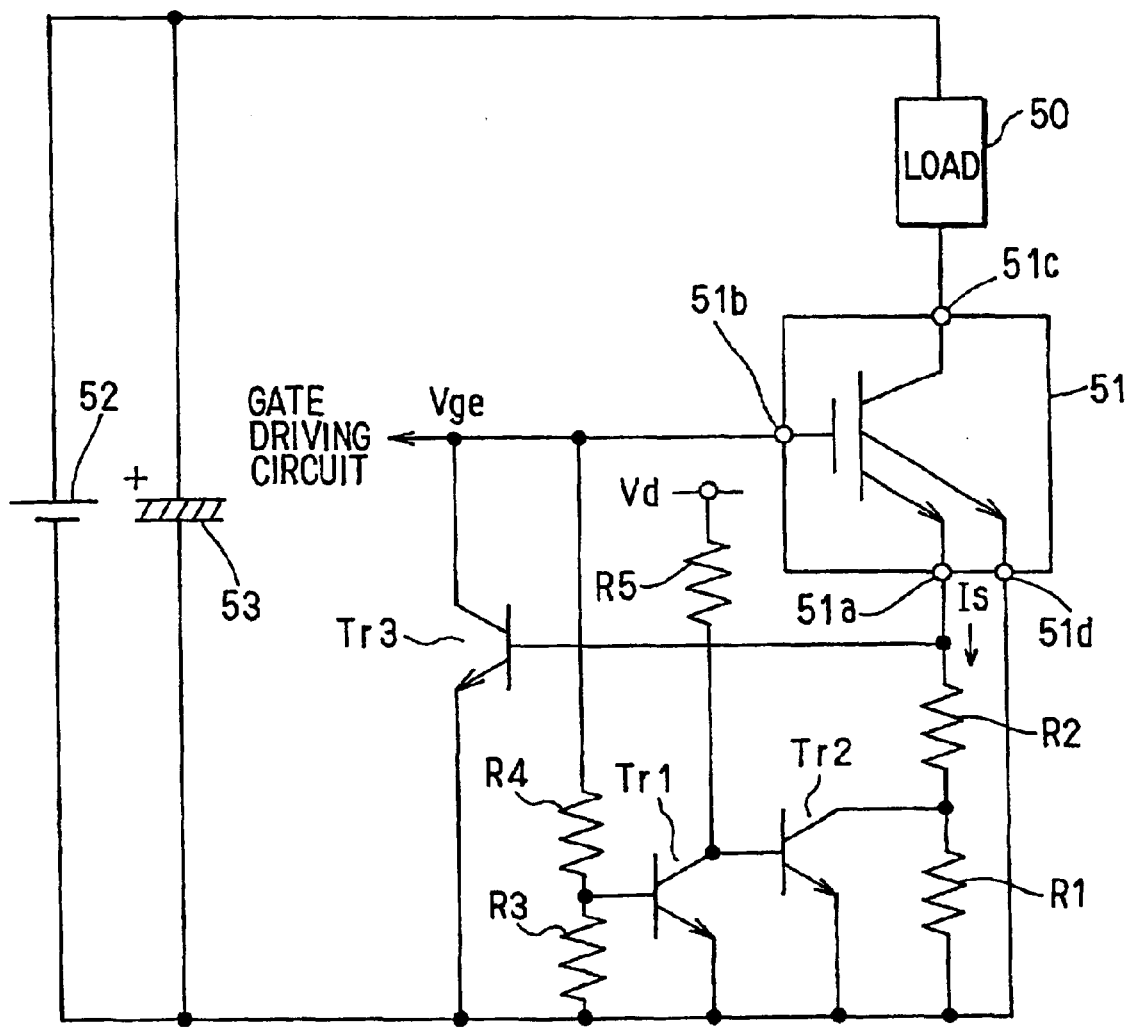
FIG. 13 is a diagram depicting a circuitry of a load driving arrangement in a sixth embodiment of the invention.

FIG. 13 is an illustration depicting a schematic configuration of a load driving arrangement using an IGBT as a semiconductor switching element to supply electric current to a load like a motor.

An IGBT 51, a gate control transistor Tr3, a main emitter terminal 51b, and a sub emitter terminal 51a in this embodiment correspond to the IGBT 4, overcurrent limiting transistor 26, the emitter terminal 4c, and the sense terminal 4d in the first embodiment, respectively.

Moreover, current detection resistors R1 and R2 correspond to the sense resistor 12 in the first embodiment while a resistor corresponding to the sense resistor 11 is omitted. Furthermore, a GATE DRIVING CIRCUIT shown in FIG. 13 corresponds to the input logic circuit 2 and the driver circuit.

As shown in FIG. 13, the load driving circuit is arranged for driving a load 50 such as a heater or the like. The IGBT (Insulated Gate Bipolar transistor) 51 is serially disposed to the load 50 for controlling current carrying to the load 50. Two current detection resistors R1 and R2 is connected to the emitter terminal 51a in series for detecting a sub IGBT current flowing out from a sub emitter terminal 51a of the IGBT 51. Two gate voltage detection resistors R3 and R4 are connected between a gate terminal 51b and ground for detecting a gate voltage (Vge) applied to a gate terminal 51b of the IGBT 51. A first switching transistor Tr1 is turned on/off depending on a voltage of a connecting point of the gate voltage detection resistors R3 and R4. A second switching transistor Tr2 is turned on/off depending on a collector voltage of the first switching transistor Tr1 for short-circuiting the current detection resistor R1. A gate control transistor Tr3 is turned on/off depending on a voltage of the sub emitter terminal 51a for controlling the gate voltage Vge to protect the IGBT 51 from the destruction by the overcurrent.

A collector terminal 51c is connected to a positive electrode side of a battery 52 through the load 50. A main emitter terminal 51d is connected to a negative electrode side of the battery 52. The sub emitter terminal 51a is also connected to the negative electrode side of the battery 52 through the two current detection resistors R1 and R2. Besides, the gate terminal 51b is connected to a gate driving circuit (not shown) by which the gate voltage Vge is controlled. The current carrying though the IGBT 51 (consequently the current carrying through the load 50) is controlled.

Furthermore, a negative electrode side of the power supply of the gate driving circuit is connected to the negative electrode side of the battery 52 (i.e. the common ground) as not shown. Additionally, the IGBT 51 is configured by a plurality of unit cells each having an IGBT structure and connecting each other in parallel. The sub emitter terminal 51a is configured of a part of the plurality of unit cells thereof while the main emitter terminal 51b is configured of the other large number of the plurality of unit cells.

Thus, a current approximately equal to the current carrying through the load (i.e. the current flowing into the collector terminal 51c) flows from the main emitter terminal 51d as a main current and a minute electric current (about 1/10000 of the main current in the embodiment) proportional to the main current flows out of the sub emitter terminal as a sub current Is.

On this account, the current carrying through the IGBT 51 is monitored by detecting the sub current Is with the two current detection resistors R1 and R2.

The two current detection resistors R1 and R2 are serially connected each other. One end of the current detection resistor R1 is connected to the negative electrode side of the battery 52 and one end of the current detection resistor R2 is connected to the sub emitter terminal 51a of the IGBT 51.

Furthermore, the gate voltage detection resistors R3 and R4 are serially connected each other as well. One end of the gate voltage detection resistor R3 is connected to the negative electrode side of the battery 52 and one end of the gate voltage detection resistor R4 is connected to the gate terminal 51b of the IGBT 51.

A base of the first switching transistor Tr1 is connected to the connecting point of the two gate voltage detection resistors R3 and R4. An emitter of the first switching transistor Tr1 is connected to the negative electrode side of the battery 52 and a collector is connected through a resistor R5 to the positive electrode side of the power supply (a power supply voltage is Vd, for example) of the gate driving circuit.

When a base voltage of the first switching transistor Tr1 (a voltage at the connecting point between the gate voltage detection resistors R3 and R4) has become a predetermined on voltage or above, this first switching transistor Tr1 is turned on.

Specifically, a resistance value of each of the gate voltage detection resistors R3 and R4 is set so that the first switching transistor Tr1 is turned on when the gate voltage Vge of the IGBT 51 becomes greater than a predetermined threshold value Vbor (10V, for example). Therefore, for example, when the gate voltage Vge is still equal to or under the threshold value Vbor during a turn on right after the current carrying through the IGBT 51 has started or during a turn off, the first switching transistor Tr1 is not turned on.

On the other hand, when the gate voltage Vge is at a predetermined on voltage (15V, for example) and the current carrying to the load 50 is steadily conducted (i.e., when the gate voltage Vge is greater than the threshold value Vbor), for example, the first switching transistor Tr1 is turned on.

In addition, since the threshold value Vbor is needed to set greater than a threshold voltage Vth (3V, for example) at which the current carrying to the IGBT starts and to set to a value smaller than the on voltage (15V, for example) to fully turn on the IGBT, it is set 10V in the embodiment.

In the second switching transistor Tr2, a base is connected to the collector of the first switching transistor Tr1, an emitter is connected to the negative electrode side of the battery 52 and a collector is connected to a connecting point of the two current detection resistors R1 and R2. The second switching transistor Tr2 is not turned on because its base voltage is low when the first switching transistor Tr1 is on, while the second switching transistor Tr2 is turned on when the first switching transistor Tr1 is off.

In a gate control transistor Tr3, a base is connected to the sub emitter terminal 51a of the IGBT 51, an emitter is connected to the negative electrode side of the battery 52 and a collector is connected to the gate terminal of the IGBT 51.

A voltage applied to the base is determined with a voltage drop generated by the two current detection resistors R1 and R2 when the second switching transistor Tr2 is off. On the other hand, when the second switching transistor Tr2 is on, the current detection resistor R1 is short-circuited and thus a voltage drop generated by the current detection resistor R2 (because the on voltage of the second switching transistor Tr2 is the value as small as that can be neglected) is applied to the base of the gate control transistor Tr3.

In addition, since the on voltage of the second switching transistor Tr2 is the value as small as that can be neglected as described above, the current detection resistor R1 is considered to short-circuit when the second switching transistor Tr2 has been turned on in this embodiment.

Next, in the load drive circuit of this embodiment, a protecting operation when the overcurrent is carried through the IGBT 51 will be described.

First, when the IGBT is fully turned on and the current carrying to the load 50 is steadily conducted, the gate voltage Vge is the predetermined on voltage (it is 15V in the embodiment) and is greater than the threshold value Vbor as described above. Therefore, the voltage drop by the gate voltage detection resistor R3 in the gate voltage Vge, i.e. the voltage applied to the base of the first switching transistor Tr1 becomes greater than a minimum voltage required to turn on the first switching transistor Tr1 and the first switching transistor Tr1 is turned on.

When the first switching transistor Tr1 is turned on, the base voltage of the second switching transistor Tr2 becomes the on voltage between the emitter and the collector of the first switching transistor Tr1, and the base voltage is very a minute voltage and thus the second switching transistor Tr2 is not turned on. Therefore, the voltage applied to the base of the gate control transistor Tr3 will correspond to the voltage drop by the two current detection resistors R1 and R2, i.e. Is×(R1+R2).

At this time, when the overcurrent flows through the IGBT 51 due to the abnormality such as the short circuit of the load 50 or the like, the sub current Is also increases according to the main current. Then, when voltage drop by the two current detection resistors R1 and R2 reaches a minimum voltage required to turn on the gate control transistor Tr3, the gate control transistor Tr3 is turned on and the gate voltage Vge drops (to the on voltage between the emitter and the collector of the gate control transistor Tr3). Thereby, the IGBT 51 is turned off so that the IGBT 51 can be protected from the destruction due to the overcurrent.

On the other hand, while the IGBT 51 is being turned on or off and the gate voltage Vge is equal to or under the predetermined threshold value Vbor, the voltage drop by the gate voltage detection resistor R3 (the base voltage of the first switching transistor Tr1) does not satisfy the voltage required to turn on the first switching transistor Tr1 and thus the first switching transistor Tr1 is turned off.

When the first switching transistor Tr1 is in an off state, the voltage of the battery 52 is applied to the base of the second switching transistor Tr2 through the resistor R5 and thereby the second switching transistor Tr2 is turned on. Therefore, the current detection resistor R1 is short-circuited by the second switching transistor Tr2. As a result, the voltage applied to the base of the gate control transistor Tr3 becomes voltage drop by the current detection resistor R2.

At this time, when the overcurrent flows through the IGBT 51 caused by the abnormality such as the short circuit of the load 50 or the like, the sub current Is also increases according to the main current. Then, when voltage drop by the current detection resistor R2 reaches a voltage allowing the gate control transistor Tr3 to be turned on, the gate control transistor Tr3 is turned on and the gate voltage Vge decreases. Thus, the IGBT 51 is turned off so that the IGBT 51 can be protected from the destruction due to the overcurrent.

Additionally, in this embodiment, the current detection resistor R1 is set 35 Ω and the current detection resistor R2 is set 10. Therefore, when the characteristics of FIG. 2 described in the Prior Art is applied to the IGBT 51, in the case that the overcurrent flows through the IGBT 51 due to the short circuit of the load 50 or the like when the IGBT 51 is fully turned on (it is equivalent to the Situation 2 in FIG. 14), the voltage applied to the base of the gate control transistor Tr3 at this time becomes a voltage drop by a combined resistance (45 Ω) of the two current detection resistors R1 and R2. Thus, the IGBT 51 is turned off at the time when the main current exceeds 600A and is protected from the overcurrent.

Furthermore, in the case that the overcurrent flows through the IGBT 51 because of the short circuit of the load 50 or the like while the IGBT 51 is being turned on or off and the gate voltage Vge is equal to or under the threshold value Vbor (it is equivalent to the Situation 1 in FIG. 2), the voltage applied to the base of the gate control transistor Tr3 at this time becomes the voltage drop by the current detection resistor R2 (10 Ω). Thus, the IGBT 51 is turned off when the main current exceeds 600A and is protected from the overcurrent.

As described above, in the load drive driving arrangement of this embodiment, when the gate voltage Vge is equal to or under the predetermined threshold value Vbor (when the current mirror ratio is small), the base voltage of the gate control transistor Tr3 becomes the voltage drop by the current detection resistor R2. Thus, even if the current mirror ratio is small and the ratio of the sub current Is to the main current is great, the gate control transistor Tr3 is not turned on immediately. Therefore, the protection is not more than required.

On the other hand, when the gate voltage Vge is greater than the predetermined threshold value Vbor (when the current mirror ratio is great), the base voltage of the gate control transistor Tr3 becomes the voltage drop by the current detection resistors R1 and R2. Thus, even if the current mirror ratio is great and the ratio of the sub current Is to the main current is small, the IGBT 51 is surely protected when the main current exceeds a value to be limited. Therefore, in the case that the sub current Is does not become so large regardless of the main current being the overcurrent, protection can surely be conducted.

Thus, according to the load driving arrangement of the embodiment, when the gate voltage Vge is equal to or under the predetermined threshold value Vbor, the second switching transistor Tr2 is turned on to short-circuit the current detection resistor R1. Thus, the voltage drop by the current detection resistor R2 is inputted into the base of the gate control transistor Tr3.

To the contrary, when the gate voltage Vge exceeds the predetermined threshold value Vbor, the second switching transistor Tr2 is turned off and the voltage drop by the current detection resistors R1 and R2 is inputted into the base of the gate control transistor Tr3. Thus, in the case that the gate voltage Vge is low and the ratio of the sub current Is to the main current is great, i.e., the current mirror ratio is small, the protecting operation can be prevented from being conducted by only the current detection resistor R2 with a small amount of the main current. Moreover, in the case that the gate voltage Vge is high and the current mirror ratio is great, even a small amount of the sub current Is can conduct the protecting operation using both the current detection resistors R1 and R2.

Consequently, there is no concern that the protecting operation is conducted before the current parrying through the IGBT 51 satisfies the rated value of the IGBT 51 or such that the protecting operation is not conducted in spite of carrying the excess current caused the destruction of the IGBT 51. Therefore, current-carrying during normality and the protecting operation during the abnormality can be set at the proper current values in accordance with a magnitude of the gate voltage Vge.

Additionally, the gate voltage Vge is detected by the two current detection resistors R3 and R4. When the gate voltage Vge is equal to or under the threshold value Vbor, the voltage drop by the gate voltage detection resistor R3 (the base voltage of the first switching transistor Tr1) becomes smaller than the voltage required to turn on the first switching transistor Tr1. Consequently, the second switching transistor Tr2 is turned on as well as the first switching transistor Tr1 is turned off, whereby the current detection resistor R1 is short-circuited. Thus, short-circuiting of the current detection resistor R1 is enabled. Moreover, the resistance value of the current detection resistor can surely be set according to the gate voltage Vge.

Furthermore, the current detection resistor for detecting the sub current Is is configured of the two current detection resistors R1 and R2 and the second switching transistor Tr2 has only to short-circuit the current detection resistor R1 when the gate voltage Vge is equal to or under the threshold value Vbor. Therefore, the current detection resistor can be configured more simply by appropriately selecting the resistance value of each of the current detection resistors R1 and R2.

As described above, the IGBT device has been replacing the conventional bipolar power transistor or power MOSFET as a power device and the protection measures against the overcurrent thereof are also important.

According to this embodiment, the IGBT device can surely be protected from the overcurrent as described above so that users will be able to comfortably use the IGBT device.

Here, a correspondence of components of this embodiment to components of the invention will be clarified. In this embodiment, the gate control transistor Tr3 corresponds to the overcurrent protecting unit of the invention or the overcurrent limiting transistor, the second switching transistor Tr2 corresponds to the short-circuiting unit of the invention, the two gate voltage detection resistors R3 and R4 correspond to the control voltage detecting unit of the invention, the first switching transistor Tr1 corresponds to the short circuit driving unit of the invention, the two current detection resistances correspond to the first and second detection resistances of the invention, respectively, the gate voltage Vge corresponds to the control voltage of the invention, the threshold value Vbor corresponds to the resistance switching voltage value of the invention and the voltage of the sub emitter terminal 51a (the base voltage of the gate control transistor Tr3) corresponds to the detected voltage of the invention.

It should be understood that the present invention is not limited by the embodiment described above anyhow and a variety of forms can be adopted as long as it falls within the technical scope of the invention.

For example, in the sixth embodiment described above, the short-circuiting operation of the current detection resistor R1 by the second switching transistor Tr2 is conducted by detecting the gate voltage Vge with the two gate voltage detection resistors R3 and R4, the first switching transistor Tr1 is controlled based on the detected gate voltage Vge (based on voltage drop by the gate voltage detection resistor R3 in detail), and the second switching transistor Tr2 is turned on/off.

Figure 16:
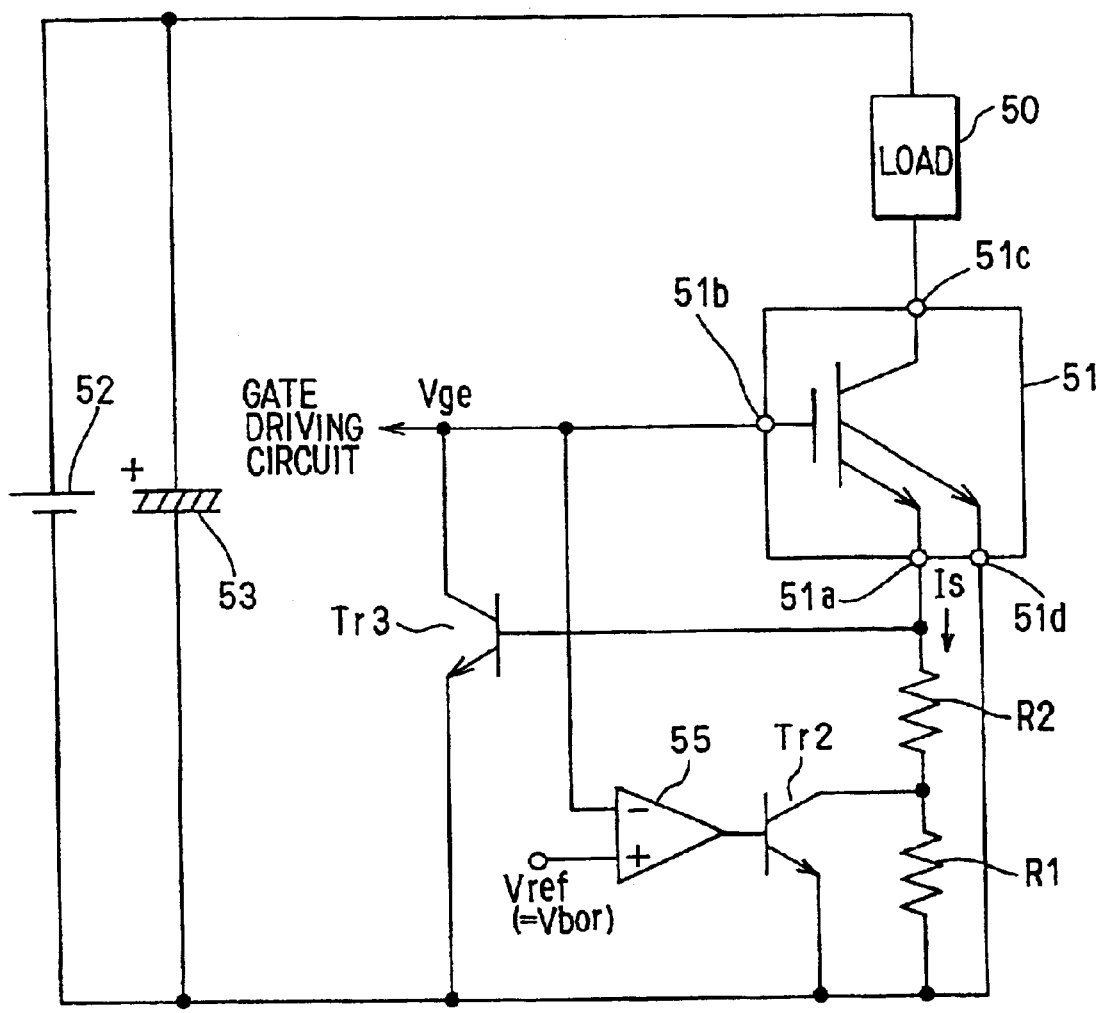
FIG. 16 is a diagram depicting another example of the load driving arrangement of the embodiment.

However, the second switching transistor Tr2 may be turned on by using a comparator 55 as shown in FIG. 16 instead of the two gate voltage detection resistors R3 and R4 and the first switching transistor Tr1 and the like.

FIG. 16 is an illustration depicting another example of the load driving arrangement of the embodiment described above. It is noted that in FIG. 16, since it has the same configuration as the load driving arrangement in FIG. 13 except the comparator 55, the same components as those in FIG. 13 are designated the same reference numerals, omitting the description thereof.

The comparator 55 is configured as the control voltage detecting unit and short-circuiting unit of the invention. The gate voltage Vge is inputted into an inverting input terminal thereof, and a reference voltage Vref is inputted into a non-inverting input terminal while an output terminal is connected to a base terminal of a second switching transistor Tr2.

The reference voltage Vref is the same value as the threshold value Vbor in the sixth embodiment described above and is generated in a reference voltage generating circuit in the gate drive circuit (both of them are not shown).

When the gate voltage Vge is smaller than the reference voltage Vref, the output from the comparator 55 becomes high-level (H level) and the second switching transistor Tr2 is turned on to short-circuit the current detection resistor R1. On the other hand, when the gate voltage Vge is greater than the reference voltage Vref, the output from the comparator 55 becomes low-level (L level) and the second switching transistor Tr2 is turned off. Consequently, the load driving arrangement shown in FIG. 16 also achieves the same an action and an effect as that in the sixth embodiment described above.

Additionally, in the sixth embodiment, although the two current detection resistors R1 and R2 are configured as the current detection resistor by serially connecting them, the three or more of resistors may be applied or a single resistor to short-circuit a part thereof may be applied appropriately.

Furthermore, although the value of the threshold value Vbor is set 10V in the sixth embodiment mentioned above, it is not limited to this, it may be set ranging within exceeding 3V (threshold voltage of the IGBT 51) to lower than 15V (on voltage). Besides, in the case of using the IGBT device having the threshold voltage or on voltage different from that of the sixth embodiment described above, the threshold value Vbor may be set in view of the threshold value voltage or on voltage of the device to be used.

Moreover, although in the embodiment described above, the device to be protected has been described in the case of the IGBT, the invention may be applicable to any devices capable of extracting a minute sub current proportional to the main current, for example, as a protection circuit of power MOSFET with a current detection terminal.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor switching element driving circuit comprising:
    a semiconductor switching element having a gate terminal, a first terminal and a second terminal for carrying a main current between the first and second terminals by applying a voltage to the gate terminal;
    an overcurrent protection circuit for decreasing the main current at a first slope and then reducing the main current at a second slope steeper than said first slope, when said main current exceeds a predetermined current value for a first period of time equal to or longer than a predetermined period of time; and
    an overcurrent limiting circuit for instantaneously dropping the voltage applied to said gate terminal when said main current becomes larger than said predetermined current value within a second period of time shorter than said predetermined period of time.

2. A semiconductor switching element driving circuit according to claim 1, wherein said overcurrent limiting circuit decreases the voltage applied to said gate terminal when said main current becomes larger than said predetermined current value within a third period of time shorter than a delay time defined by said overcurrent protection circuit.

3. A semiconductor switching element driving circuit comprising:
    a semiconductor switching element having a gate terminal, a first terminal and a second terminal for carrying a main current between the first and second terminals by applying a voltage to the gate terminal;
    an overcurrent limiting circuit for instantaneously dropping the voltage applied to said gate terminal when said main current becomes larger than a first comparison current; and
    an overcurrent protection circuit for decreasing the main current at a first inclination when said main current becomes larger than a second comparison current that is lower than said first comparison current, and then reducing the main current at a second inclination steeper than said first inclination when the main current becomes smaller than a third comparison current that is lower than said second comparison current.

4. A semiconductor switching element driving circuit according to claim 3, wherein said semiconductor switching element further comprises:
    a sense terminal connected to said semiconductor switching element for outputting a sense current substantially proportional to said main current; and
    wherein said overcurrent protection circuit comprises:
        a first comparison unit for judging whether said main current becomes larger than said second comparison current based on said sense current, and a second comparison unit for judging whether said main current becomes smaller than said third comparison current based on said sense current.

5. A semiconductor switching element driving circuit according to claim 4, wherein said overcurrent protection circuit comprises:
    a delay circuit for delaying an output of said first comparison unit for a delay time, wherein said overcurrent protection circuit decreases said main current at said first inclination after said delay time has passed.

6. A semiconductor switching element driving circuit according to claim 5, wherein said overcurrent protection circuit comprises an overcurrent protection transistor having a collector connected to said gate terminal;
    wherein said overcurrent protection circuit turns on said overcurrent protection transistor to reduce the voltage applied to said gate terminal when said second comparison unit detects said main current becomes smaller than said third comparison current after said first comparison unit detects that said main current has become larger than said second comparison current.

7. A semiconductor switching element driving circuit according to claim 6, wherein said overcurrent protection circuit comprises:
    a latch circuit for holding an output of said delay circuit; and
    an AND circuit to which outputs of said latch circuit and said second comparison unit are inputted, wherein an on state and an off state of said overcurrent protection transistor depend on an output signal of said AND circuit.

8. A semiconductor switching element driving circuit according to claim 1, further comprising:
    a sense terminal connected to said semiconductor switching element for carrying a sense current substantially proportional to said main current;
    wherein said overcurrent limiting circuit comprises:
        an overcurrent limiting transistor having a collector connected to said gate terminal and a base to which a voltage controlled based on said sense current is applied, wherein said overcurrent limiting transistor is turned on to reduce the voltage applied to said gate terminal based on said sense current.

9. A semiconductor switching element driving circuit according to claim 1, wherein said semiconductor switching element is an IGBT having a collector terminal as said first terminal and an emitter terminal as said second terminal.

10. A semiconductor switching element driving circuit according to claim 9, wherein said IGBT has a plurality of elements each having different threshold voltages and connected each other substantially in parallel.

11. A semiconductor switching element driving circuit according to claim 9, wherein said IGBT has a plurality of elements respectively forming channels in different plane directions, whereby threshold voltages of the elements are different from each other.

12. A semiconductor switching element driving circuit according to claim 11, wherein one of said plane directions is {100}.

13. A semiconductor switching element driving circuit according to claim 12, wherein said IGBT comprises:
    a gate electrode being connected to said gate terminal of said IGBT, forming a top geometry thereof in a hexagonal shape on a plane parallel to a surface of a semiconductor substrate on which the IGBT is formed, and having a plurality of faces each orienting different plane directions, wherein one of said plane directions is {100}.

14. A semiconductor switching element driving circuit comprising:
   a semiconductor switching element having a gate terminal, a first terminal and a second terminal for carrying a main current between the first and second terminals by applying a voltage to the gate terminal;
   an overcurrent protection circuit for decreasing the main current at a first slope and then reducing the main current at a second slope steeper than said first slope, when said main current exceeds a predetermined current value for a first period of time equal to or longer than predetermined period of time; and
   an overcurrent limiting circuit for instantaneously dropping the voltage applied to said rate terminal when said main current becomes larger than said predetermined current value within a second period of time shorter than said predetermined period of time;
   wherein said semiconductor switching element is an IGBT having a collector terminal as said first terminal and an emitter terminal as said second terminal, and
   wherein said IGBT has a gate electrode having a striped shape, and forming channels on both sides of said gate electrode, and having different threshold voltages on both sides of the gate electrode.

15. A semiconductor switching element driving circuit according to claim 14, wherein the threshold voltage on one of said both sides of said gate electrode is varied by conducting an obliquely ion implantation with respect to a surface of a semiconductor substrate on which the IGBT is formed for adjusting the threshold voltage.

16. A semiconductor switching element driving circuit according to claim 1, wherein said semiconductor switching element driving circuit is utilized to an automobile motor driving circuit for controlling a motor of an electric vehicle or hybrid vehicle.

17. A semiconductor switching element driving circuit comprising:
   a semiconductor switching element having a gate terminal, a first terminal and a second terminal for carrying a main current between the first and second terminals by applying a voltage to the gate terminal;
   an overcurrent protection circuit for decreasing the main current at a first slope and then reducing the main current at a second slope steeper than said first slope, when said main current exceeds a predetermined current value for a first period of time equal to or longer than a predetermined period of time; and
   an overcurrent limiting circuit for instantaneously dropping the voltage applied to said gate terminal when said main current becomes larger than said predetermined current value within a second period of time shorter than said predetermined period of time;
   a sense terminal connected to said semiconductor switching element for carrying a sense current substantially proportional to said main current;
   wherein said overcurrent limiting circuit comprises:
      a current detection resistance connected to said sense terminal for converting said sense current outputted from the sense terminal into a detection voltage; and
      a detection resistance switching unit for decreasing a resistance value of said current detection resistance until said voltage applied to the gate terminal is under a predetermined value which is lower than a full-on voltage by which said semiconductor switching element becomes a full on state.

18. A semiconductor switching element driving circuit according to claim 3,
   wherein said overcurrent limiting circuit comprises:
      a current detection resistance connected to a detection terminal for converting said detection current outputted from the detection terminal into a detection voltage; and
      a detection resistance switching unit for decreasing a resistance value of said current detection resistance until said gate voltage applied to the gate terminal is under a reference voltage which is lower than a full-on voltage by which said semiconductor switching element becomes a full on state.

19. A semiconductor switching element driving circuit according to claim 18, wherein said detection resistance switching unit comprises:
   a control voltage detecting unit for detecting said control voltage;
   a short-circuiting unit for short-circuiting a part of said current detection resistance; and
   a short circuit driving unit for decreasing the resistance value of said current detection resistance by driving said short-circuiting unit during said control voltage detected by said control voltage detecting unit is under the reference voltage.

20. A semiconductor switching element driving circuit according to claim 19, wherein said current detection resistance comprises a first detection resistance connected to a second detection resistance in series;
   wherein said short-circuiting unit short-circuits one of said first detection resistance and said second detection resistance.

21. A semiconductor switching element driving circuit according to claim 18, wherein said semiconductor switching element is an IGBT having a gate terminal as said control terminal, a collector terminal as said first terminal, and an emitter terminal having a main emitter terminal as said second terminal and a sub emitter terminal as said detection terminal.

* * * * *